United States Patent
Baars et al.

(10) Patent No.: US 9,484,457 B2
(45) Date of Patent: Nov. 1, 2016

(54) VERTICAL FLOATING BODY STORAGE TRANSISTORS FORMED IN BULK DEVICES AND HAVING BURIED SENSE AND WORD LINES

(75) Inventors: Peter Baars, Dresden (DE); Till Schloesser, Dresden (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 580 days.

(21) Appl. No.: 13/404,759

(22) Filed: Feb. 24, 2012

(65) Prior Publication Data

US 2012/0217612 A1    Aug. 30, 2012

(30) Foreign Application Priority Data

Feb. 25, 2011   (DE) .................. 10 2011 004 757

(51) Int. Cl.
H01L 21/74      (2006.01)
H01L 29/78      (2006.01)
H01L 27/108     (2006.01)

(52) U.S. Cl.
CPC ..... H01L 29/7841 (2013.01); H01L 27/10802 (2013.01)

(58) Field of Classification Search
CPC ........... H01L 21/743; H01L 27/10876; H01L 27/10891

USPC ......................................................... 257/508
See application file for complete search history.

(56) References Cited

U.S. PATENT DOCUMENTS

| | | | | |
|---|---|---|---|---|
| 4,060,738 A | * | 11/1977 | Tasch et al. | 365/183 |
| 4,353,082 A | * | 10/1982 | Chatterjee | H01L 21/743 |
| | | | | 257/296 |
| 5,340,758 A | * | 8/1994 | Wei et al. | 438/158 |
| 6,617,651 B2 | * | 9/2003 | Ohsawa | 257/366 |
| 7,241,658 B2 | * | 7/2007 | Forbes | 438/242 |
| 7,564,084 B2 | * | 7/2009 | Song et al. | 257/296 |
| 8,377,813 B2 | * | 2/2013 | Lin | 438/589 |
| 2003/0015757 A1 | | 1/2003 | Ohsawa | |
| 2007/0051994 A1 | | 3/2007 | Song et al. | |

OTHER PUBLICATIONS

Translation of Official Communication from German Patent Application No. 10 2011 004 757.3 dated Dec. 21, 2011.

* cited by examiner

*Primary Examiner* — Thomas L Dickey
(74) *Attorney, Agent, or Firm* — Amerson Law Firm, PLLC

(57) ABSTRACT

A semiconductor device comprises a memory area including floating body transistors in the form of pillar structures, which are formed in a bulk architecture. The pillar structures may be appropriately addressed on the basis of a buried word line and a buried sense region or sense lines in combination with an appropriate bit line contact regime.

10 Claims, 18 Drawing Sheets

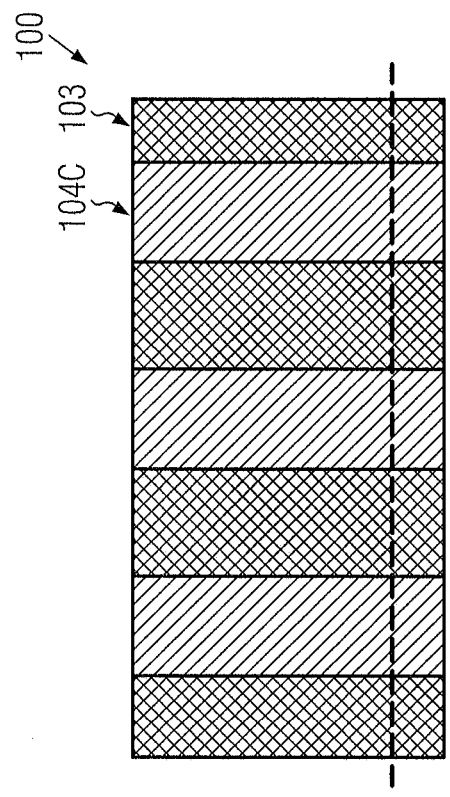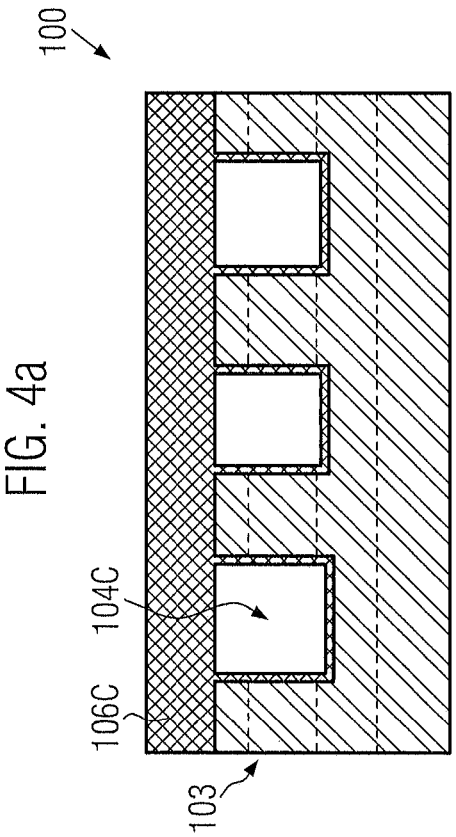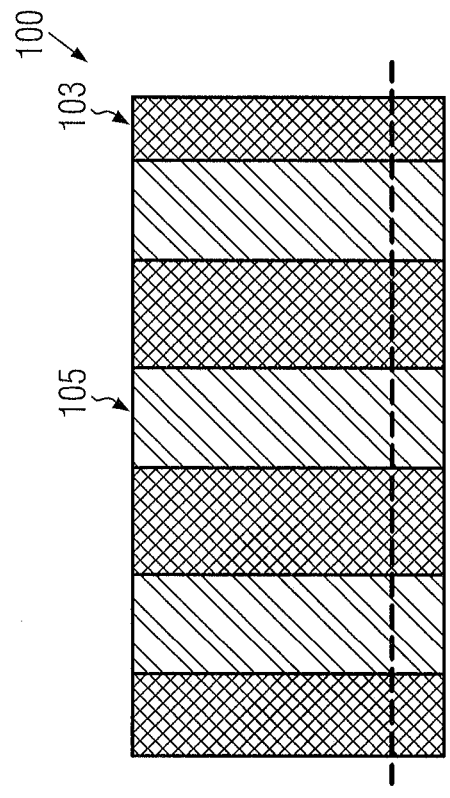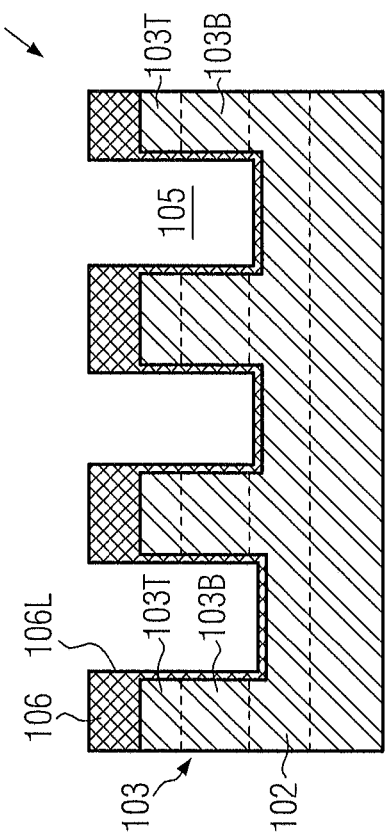

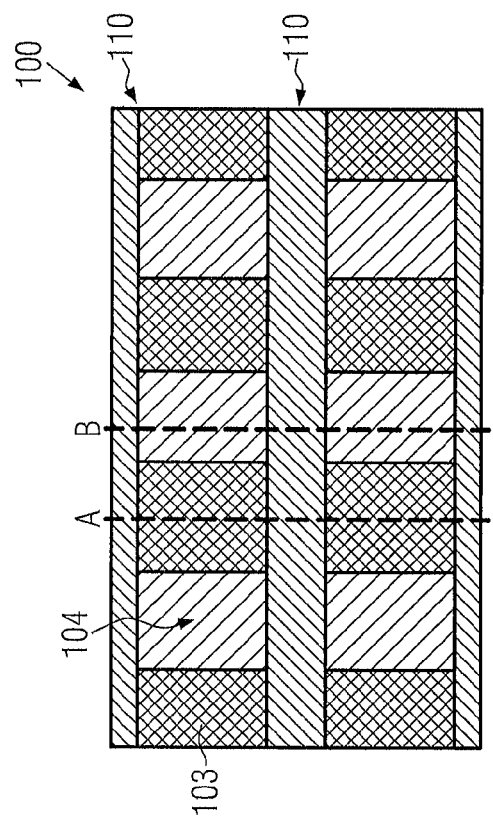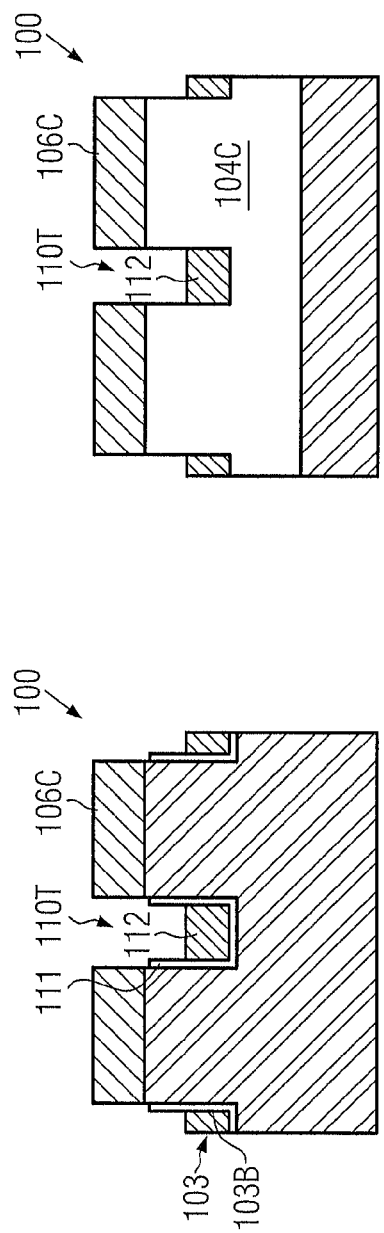

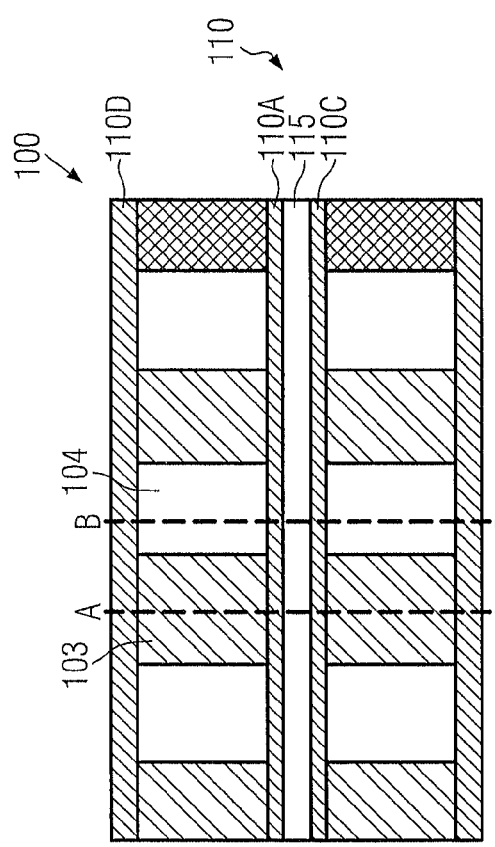
FIG. 6a
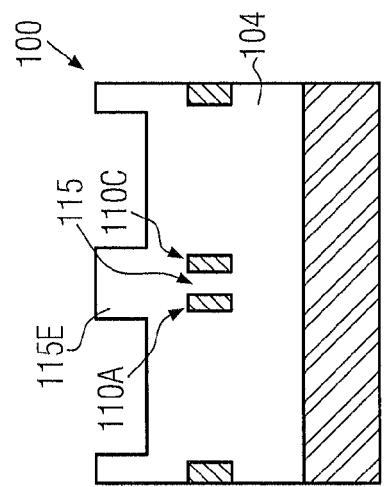
FIG. 6c B-B
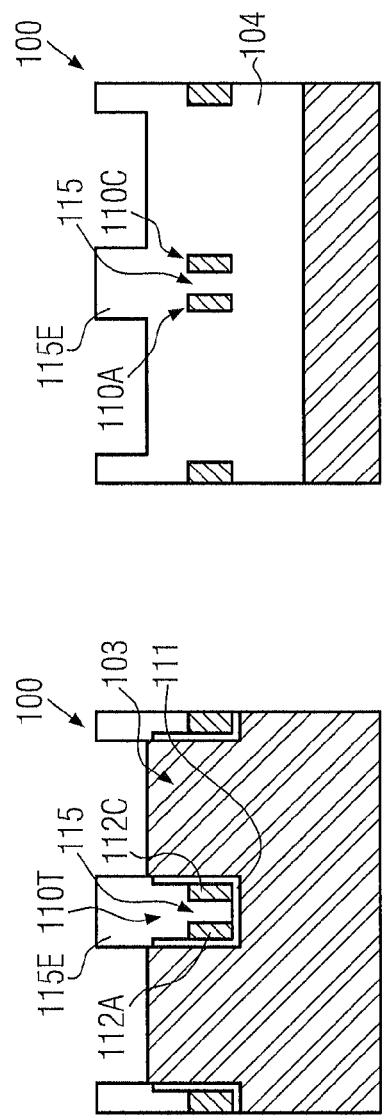
FIG. 6b A-A

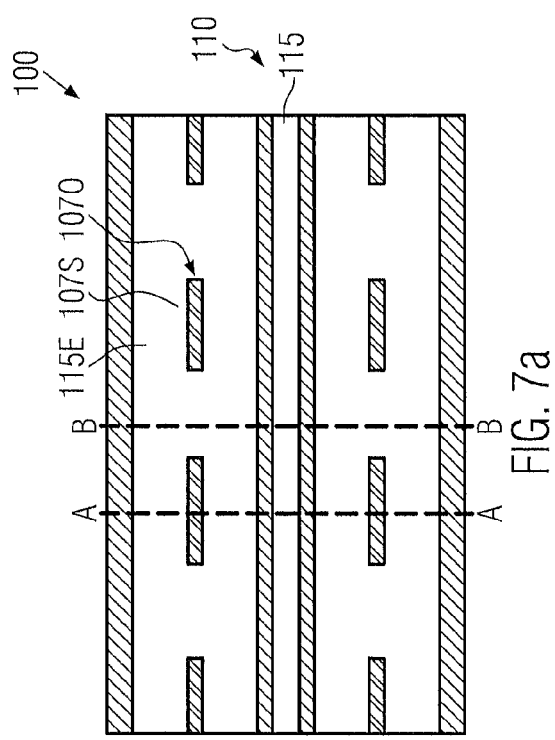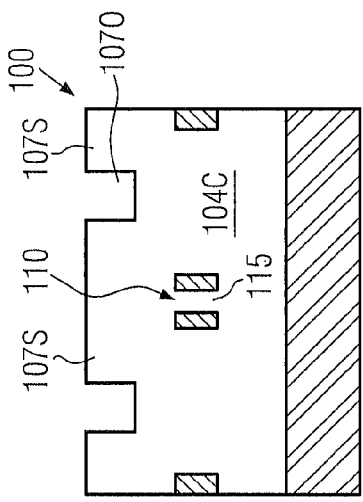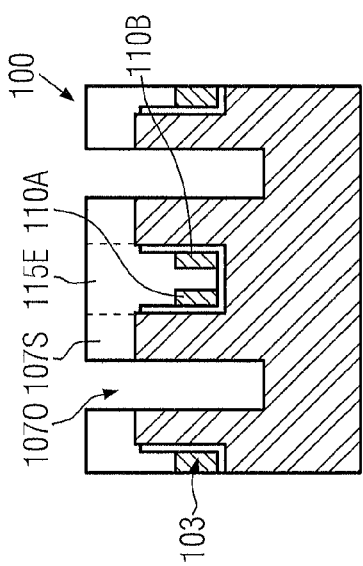

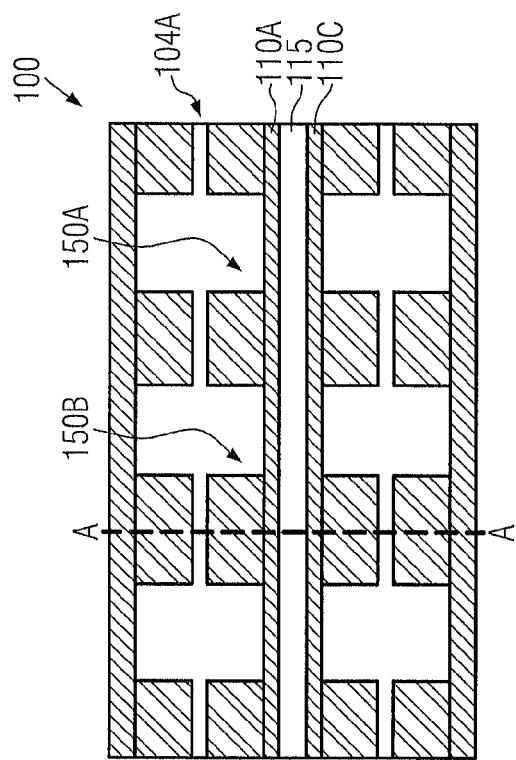
FIG. 8a
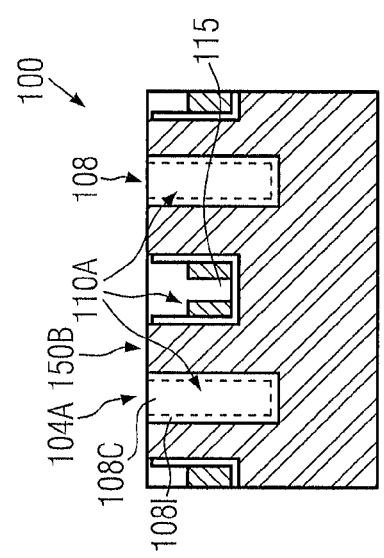
FIG. 8b A-A

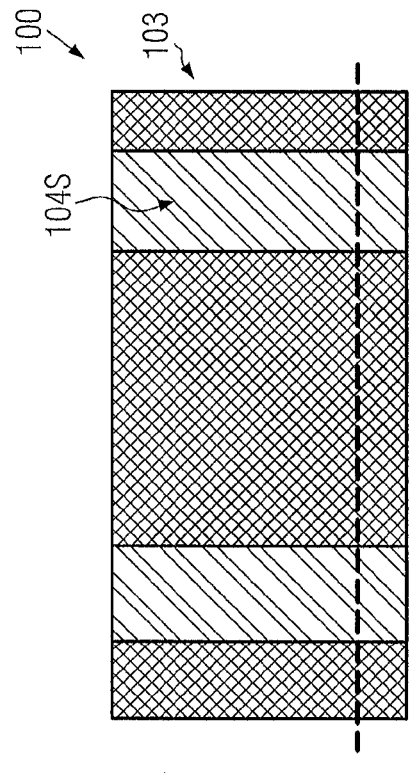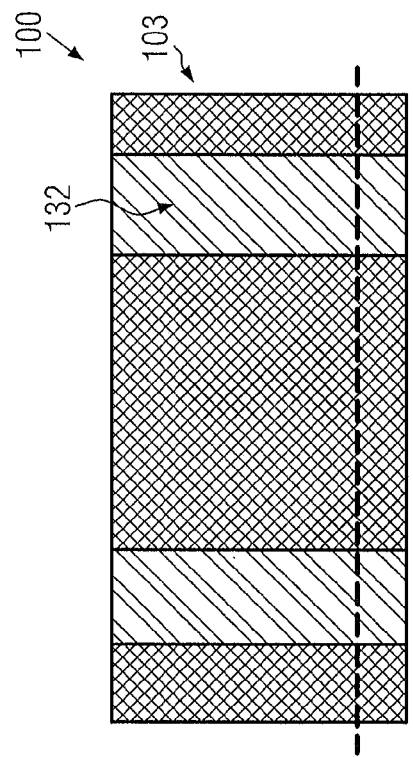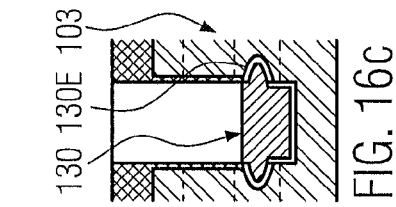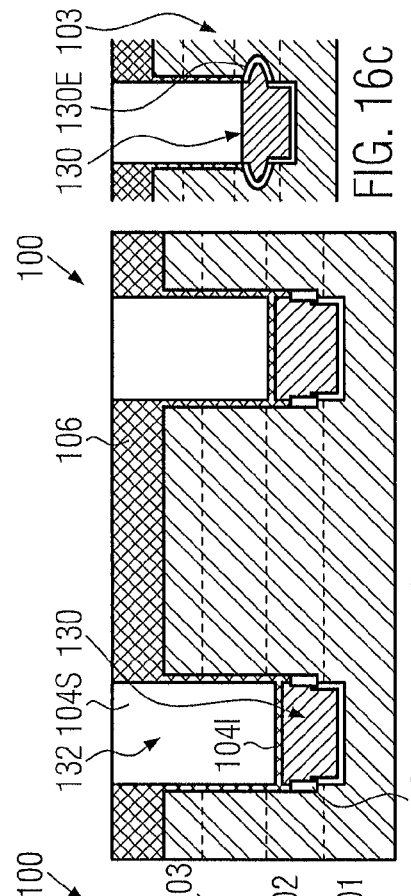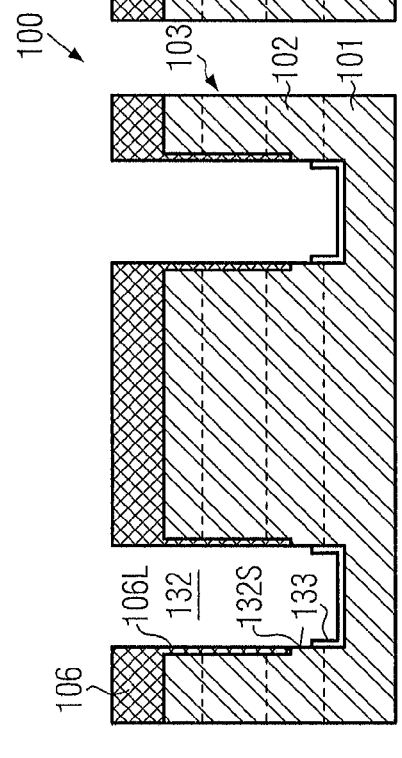

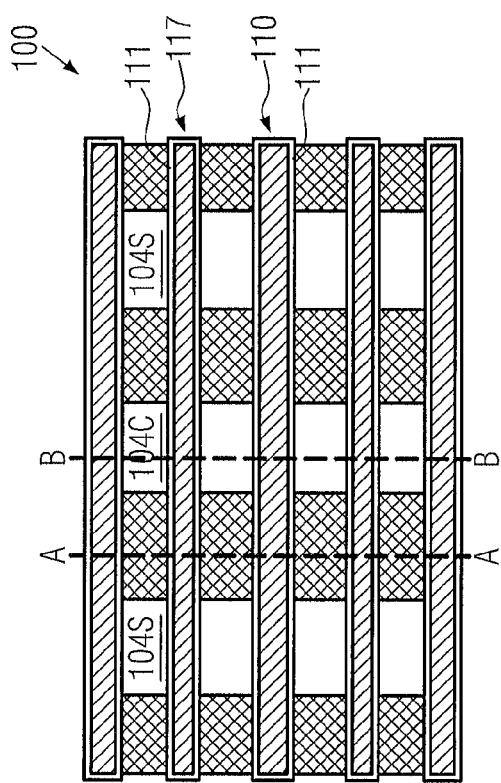
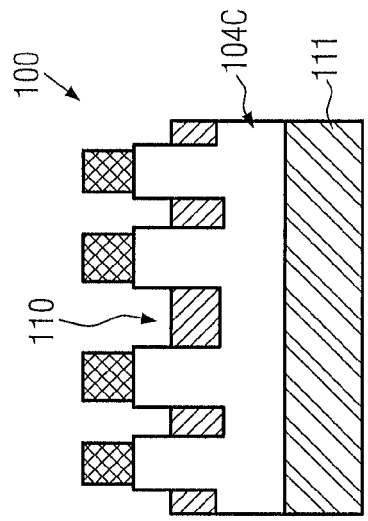
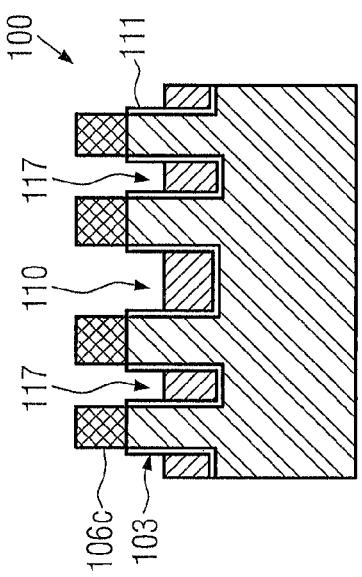
FIG. 19a
FIG. 19c B-B
FIG. 19b A-A

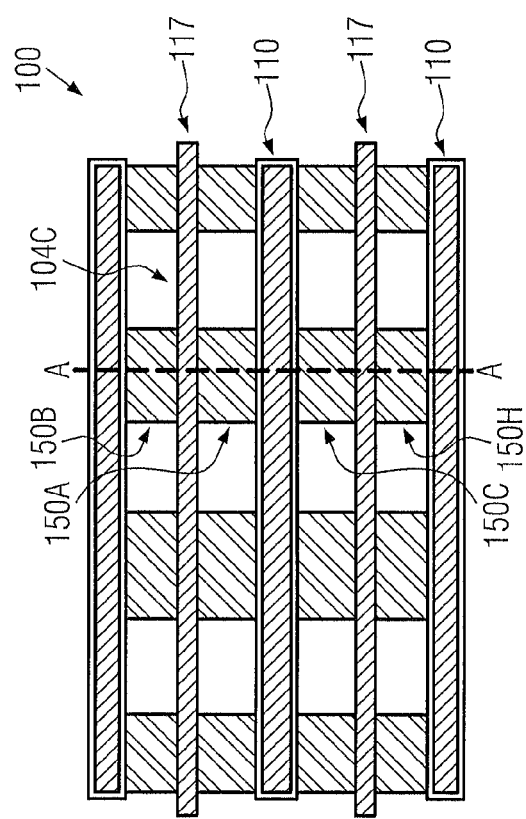
FIG. 20a
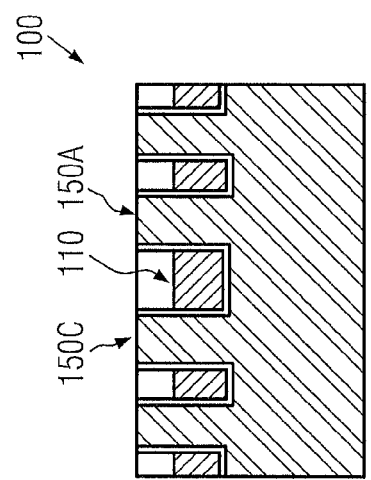
FIG. 20b A-A

VERTICAL FLOATING BODY STORAGE TRANSISTORS FORMED IN BULK DEVICES AND HAVING BURIED SENSE AND WORD LINES

BACKGROUND OF THE INVENTION

1. Field of the Invention

Generally, the present disclosure relates to the field of integrated circuits, and, more particularly, to field effect transistors in complex circuits which may include a memory area, wherein information is stored by controlling charge in a floating body of the transistor.

2. Description of the Related Art

Integrated circuits typically comprise a very high number of circuit elements on a given chip area according to a specified circuit layout, wherein advanced devices may comprise millions of signal nodes that may be formed by using field effect transistors or MOS transistors. In the context of the present disclosure, the terms field effect transistors and MOS transistors are considered as synonyms. Thus, field effect transistors may represent a dominant component of modern semiconductor products, wherein advances in performance and low integration volume are mainly associated with a reduction of size of the basic transistor structures. Generally, a plurality of process technologies are currently practiced, wherein, for complex circuitry, such as microprocessors, storage chips, ASICs (application specific ICs) and the like, MOS technology is currently one of the most promising approaches due to the superior characteristics in view of operating speed and/or power consumption and/or cost efficiency. During the fabrication of complex integrated circuits using MOS technology, millions of field effect transistors, i.e., N-channel transistors and/or P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, in combination with the capability of rapidly creating a conductive channel near the insulating layer upon application of the control voltage to the gate electrode, the conductivity of the channel region substantially determines the performance of the MOS transistors. Thus, the latter aspect renders the reduction of the channel length a dominant design criterion for accomplishing an increase in the operating speed of the integrated circuits.

Due to the decreased dimensions of circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC). Furthermore, in sophisticated microcontroller devices, an increasing amount of storage capacity may be provided on chip with the CPU core, thereby also significantly enhancing the overall performance of modern computer devices. For example, in typical microcontroller designs, different types of storage devices may be incorporated so as to provide an acceptable compromise between die area consumption and information storage density on the one side versus operating speed on the other side. For instance, fast or temporary buffer memories, so-called cache memories, may be provided in the vicinity of the CPU core, wherein respective cache memories may be designed so as to allow for reduced access times compared to external storage devices. Since a reduced access time for a cache memory may typically be associated with a reduced storage density thereof, the cache memories may be arranged according to a specified memory hierarchy, wherein a level 1 cache memory may represent the memory formed in accordance with the fastest available memory technology. For example, static RAM memories may be formed on the basis of registers, thereby enabling an access time determined by the switching speed of the corresponding transistors in the registers. Typically, a plurality of transistors may be required so as to implement a corresponding static RAM cell. In currently practiced approaches, up to six transistors may typically be used for a single RAM memory cell, thereby significantly reducing the information storage density compared to, for instance, dynamic RAM memories including a storage capacitor in combination with a pass transistor. However, usage of storage capacitors may require a regular refreshing of the charge stored in the capacitor, while writing to and reading from the dynamic RAM memory cell may also require relatively long access times so as to appropriately charge and discharge the storage capacitor. Thus, although a high information storage density is provided, in particular when vertical storage capacitor designs are considered, these memory devices may not be operated with high frequency and, therefore, dynamic RAM memories may typically be used for chip internal memories, for which an increased access time may be acceptable.

Moreover, in view of further enhancing device performance, in particular with respect to individual transistor elements, the SOI (semiconductor- or silicon-on-insulator) architecture has continuously been gaining in importance for manufacturing fast transistors due to their characteristics of a reduced parasitic capacitance of the PN junction, thereby typically allowing higher switching speeds compared to bulk transistors. In SOI transistors, the semiconductor region separating the drain and source regions and accommodating the channel regions, also referred to as the body region, is dielectrically encapsulated. This configuration provides significant advantages, but also gives rise to a plurality of issues. Contrary to the body of planar bulk devices, which is electrically connected to the substrate, and thus applying a specified potential to the substrate, maintaining the body of the bulk transistor at a specified potential, the body of SOI transistors is not connected to a specified reference potential. Hence, the body's potential may usually float due to accumulating charge carriers which may be generated by impact ionization, and the like, thereby leading to a variation of the threshold voltage (Vt) of the transistor, depending on the "switching history" of the transistor, which may also be referred to as hysteresis. The threshold voltage represents the voltage at which a conductive channel forms in the body region between the drain region and the source region of the transistor.

The floating body effect is considered disadvantageous for the operation of regular transistor elements, for instance, in particular, for static RAM memory cells, since the operation dependent threshold voltage variation may result in significant instabilities of the memory cell which may not be tolerable in view of data integrity of the memory cell. Consequently, in conventional SOI devices including memory blocks, the drive current fluctuations associated with the threshold voltage variations are taken into consideration by appropriate design measures in order to provide a sufficiently high drive current range of the SOI transistors in the memory block. However, with respect to increasing information density for memory devices compared to static RAM memories and also compared to dynamic RAM memories, as previously explained, the floating body effect and the variation of the threshold voltage associated therewith may be taken advantage of by using the floating body of an SOI transistor as a charge storage region. In this manner, information may be stored in the transistor itself, thereby no longer requiring a charge storage capacitor as in dynamic RAM cells, while also providing the potential for achieving approximately five times the density of current static RAM memories typically comprising six transistor elements.

Consequently, so-called floating body storage transistors have been developed in which charge may intentionally be accumulated in the body region so as to represent a logic high state or low state, depending on the memory technique.

Hence, the technique of floating body storage transistors is a promising approach for significantly increasing information density in SOI semiconductor devices. It turns out, however, that the implementation of "floating body" transistors in other device architectures, which are not compatible with the SOI configuration, for instance due to overall heat dissipation capabilities and the like, is difficult to achieve. For example, in bulk architectures, the body region of planar transistors is in direct contact with the crystalline substrate material so that the isolation of the body region has to be accomplished on the basis of well implantations, thereby significantly increasing the risk of shorting the source and drain regions. Furthermore, for reduced ground rules of small cell sizes, the short channels lead to high electric fields and, thus, to increased leakage currents, thereby significantly reducing overall performance of the storage transistors and also contributing to significant power consumption.

In view of the situation described above, the present disclosure relates to semiconductor devices and manufacturing techniques in which floating body storage transistors and corresponding memory cells and arrays may be provided on bulk architectures while avoiding, or at least reducing the effects of, one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which floating body transistors used for memory cells may be provided above a bulk architecture of a semiconductor device by using a non-planar transistor architecture. According to the principles disclosed herein, the body region and the drain region or the source region may be provided as a stacked configuration, thereby forming a substantially "pillar-like" structure, which may also be referred to herein as a pillar structure. On the other hand, the other one of the drain or source region may be provided below the pillar structure and may connect to a plurality of other pillar structures, for instance in the form of a sense line, while, in other illustrative embodiments disclosed herein, a substantially continuous semiconductor region may act as a "common" drain or source region or sense region of a plurality of pillar structures. The non-planar configuration of the storage transistors in the form of a pillar structure and a sense region or sense line connecting to a plurality of pillar structures results in superior isolation characteristics for the body region and additionally enables the formation of the corresponding memory cells with a reduced area so that, in some illustrative embodiments, the memory cells may be formed with a size corresponding to $4F^2$, i.e., the memory cells may be formed on the basis of four times the square of the minimum feature size of the technology standard under consideration. The desired basic geometric configuration of the pillar structure may be defined on the basis of appropriate trench isolation regions, which may be formed so as to extend substantially perpendicular to each other, thereby resulting in a very space-efficient configuration, such as a square-like configuration or any other rectangular configuration when considering the storage transistor from a top view. The body region of the pillar structures may be efficiently provided with an appropriate buried word line system, in combination with an appropriate bit line system, in order to enable accessibility for individual pillar structures. In some illustrative embodiments disclosed herein, the buried word line system may comprise an architecture in which an initial combined word line may be split into two electrically isolated word lines on the basis of a self-aligned manufacturing technique, thereby achieving a very efficient accessibility of the individual pillar structures by selecting a single bit line and a single word line, while the sense region may be common for all of the pillar structures. In other illustrative embodiments disclosed herein, the buried word line may be provided so as to connect to the floating bodies of a plurality of pillar structures at both sides, while appropriate accessibility may be implemented by providing appropriately grouped pillar structures, wherein each group is connected to the same bit line in combination with an appropriate architecture of paired sense lines, also in this case the individual accessibility of the pillar structures is achieved.

One illustrative semiconductor device disclosed herein comprises a plurality of pillar structures formed in a semiconductor layer that comprises a doped top layer of a first conductivity type and a doped bottom layer that is formed below the doped top layer and that has a second conductivity type, wherein the doped top and bottom layers form a first PN junction. The semiconductor device further comprises a buried doped semiconductor region of the first conductivity type that is formed below the bottom layer of the plurality of pillar structures so as to form a second PN junction with the doped bottom layer. Additionally, the semiconductor device comprises a buried word line formed laterally adjacent to the doped bottom layers of at least some of the plurality of pillar structures, wherein the buried word line is separated from the doped bottom layers by a dielectric layer.

One illustrative method disclosed herein comprises forming a stack of doped semiconductor layers above a doped semiconductor region of a first conductivity type, wherein the stack comprises a top layer of the first conductivity type and a bottom layer of a second conductivity type, wherein the bottom layer forms a PN junction with the doped semiconductor region. The method further comprises forming first trench isolation regions in the stack of doped semiconductor layers and forming combined word lines in the stack of doped semiconductor layers and in the first trench isolation regions, wherein the combined word lines extend substantially transversely to the first trench isolation regions. Furthermore, the method comprises forming second trench isolation regions in the stack of doped semiconductor layers so as to extend substantially transversely to the first trench isolation regions and so as to laterally delineate, in combination with the first trench isolation regions and the combined word lines, a plurality of pillar structures that comprise the top layers and bottom layers. Additionally, the method comprises forming a word line trench isolation region in each of the combined word lines so as to form a first split word line and a second split word line from each of the combined word lines.

A further illustrative method disclosed herein comprises forming buried sense lines so as to be in contact with a buried doped semiconductor region, wherein the sense lines comprise an isolation region extending through a stack of doped semiconductor layers, which in turn comprises a doped top layer of a first conductivity type and a doped bottom layer of a second conductivity type. The method further comprises forming trench isolation regions in the stack of doped semiconductor layers, wherein each of the trench isolation regions is formed laterally between the respective two of adjacent sense lines. Moreover, the method comprises forming buried word lines in the stack of doped semiconductor layers and in the trench isolation regions, wherein each of the buried word lines has a first side laterally adjacent to a first pillar structure and has a second side laterally opposite to the first side and wherein the second side is formed laterally adjacent to a second pillar structure. Moreover, the method comprises forming a first bit line contact region and a second bit line contact region, wherein the first bit line contact region connects to a first plurality of pillar structures and the second bit line contact region connects to a second plurality of pillar structures, wherein the first plurality of pillar structures is associated with a first one of the sense lines and the second plurality of pillar structures is associated with a second one of the sense lines. Moreover, the first and second plurality of pillar structures are associated with the same word line.

BRIEF DESCRIPTION OF THE DRAWINGS

The disclosure may be understood by reference to the following description taken in conjunction with the accompanying drawings, in which like reference numerals identify like elements, and in which:

FIGS. 3a-4b schematically illustrate top views and cross-sectional views, respectively, in a process flow for defining the pillar structure in one lateral direction, according to illustrative embodiments;

FIGS. 5a-6c schematically illustrate top views and cross-sectional views, respectively, in a further advanced manufacturing stage in which split buried word lines may be formed on the basis of a self-aligned process technique, according to illustrative embodiments;

FIGS. 7a-8b schematically illustrate top views and cross-sectional views, respectively, in a process sequence in which the semiconductor layer stack of the pillar structures may be divided in a direction perpendicular to the previously formed trench isolation regions, according to illustrative embodiments;

FIGS. 15a-16c schematically illustrate top views and cross-sectional views, respectively, in a manufacturing stage in which buried sense lines may be formed, according to illustrative embodiments;

FIGS. 19a-20b schematically illustrate top views and cross-sectional views, respectively, of the pillar structures upon forming buried word lines, which may operatively connect to a plurality of pillar structures at both sides of the buried word lines, according to illustrative embodiments;

Figure 1:
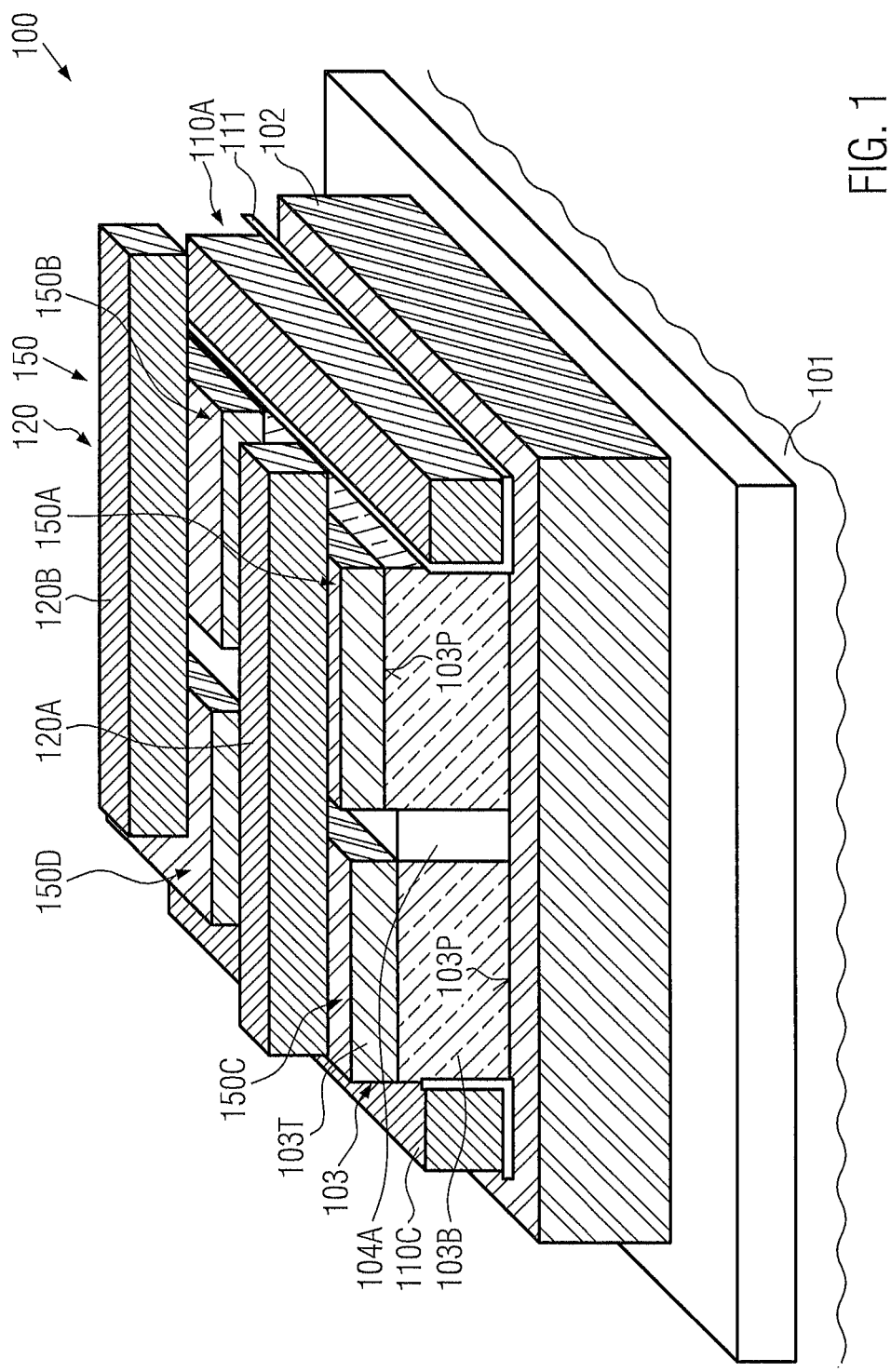
FIG. 1 schematically illustrates a perspective view of a semiconductor device comprising a plurality of pillar structures, i.e., floating body storage transistors in a non-planar architecture, which may be formed on the basis of a bulk architecture by using a shared sense plate or sense semiconductor region in combination with buried split word lines, i.e., word lines that may be split by a self-aligned isolation trench, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The principles disclosed herein relate to non-planar transistor architectures, which may be used as floating body storage transistors, wherein a drain or source region and the channel or body region may be provided as a stacked configuration, while the other one of the drain or source regions, which may act as a sense region or sense line, may be shared by a plurality of individual transistors or pillar structures, thereby providing superior electrical insulation of the floating body of the non-planar transistors. Consequently, extremely small ground rules may be applied upon forming the respective pillar structures, for instance, enabling a configuration with an area that is four times the square of the minimum feature size of the technology node under consideration, while, however, any other ground rules may be applied if considered appropriate. To this end, in some illustrative embodiments, a common buried sense plate, i.e., a continuous semiconductor region, may be provided by concurrently connecting each of a large number of pillar structures, while the individual accessibility may be accomplished by implementing respective bit line and word line systems. To this end, an initially combined word line may be split into two separate word line portions, while also the semiconductor regions positioned between two of the initial combined word lines may also be split, thereby increasing the overall information density while at the same time ensuring that each split word line portion is associated to a single row of pillar structures.

In other illustrative embodiments disclosed herein, in a double-sided buried sense line, contact information is implemented, wherein every two neighboring pillars are connected to the sense line alternatingly at the right hand side and the left hand side, respectively. Furthermore, two further pillars share the same sense line so that a splitting of the buried sense line may not be necessary while, if considered appropriate, an additional separation of the initially common sense line may be applied. Furthermore, a trench isolation region is formed on the basis of a self-aligned technology in order to define the final geometry of the pillar structures. In this manner, the constraints with respect to the lithography process and patterning regime used for forming the buried sense line are less critical, thereby avoiding undue yield loss. Furthermore, if desired, increased body capacitance may be implemented by incorporating appropriately isolated metal lines in the vicinity of the body regions of the pillar structures, which may be accomplished by forming the corresponding metal lines together with the buried word lines. In the previously described approach, a corresponding increase of body capacitance may be accomplished by incorporating a conductive material into the isolation trenches for splitting the pillar stacks positioned between the initially combined word lines.

FIG. 1 schematically illustrates a perspective view of a semiconductor device 100 which may comprise non-planar "floating body" transistors 150 formed above a substrate 101 comprising a crystalline substrate material, which may directly connect to the semiconductor material used for forming the non-planar transistors 150. In this case, the device 100 is to be considered as representing a bulk configuration, irrespective of whether any insulating material may be provided below a crystalline material portion of the substrate 101. In the embodiment shown, the pillar structures or transistors 150 may be formed on a common semiconductor region 102, which may thus represent a common drain or source region of the transistors 150. The region 102 may also be considered as a shared sense plate of the transistors 150 and may have an appropriate doping concentration provided therein so as to obtain a desired high conductivity. The transistors 150, which may also be referred to as pillar structures, are formed of a stack of doped semiconductor layers 103, i.e., a doped top layer 103T in combination with a doped bottom layer 103B, provided with an appropriate type of doping so as to form a PN junction 103P. In the embodiment shown, the top layer 103T may comprise an N-type dopant species, while the bottom layer 103B may have a P-type conductivity, thereby forming, together with the semiconductor region 102, having an N-channel transistor conductivity and an N-type transistor structure. It should be appreciated, however, that an inverse conductivity type regime may be applied in order to provide a P-channel transistor, if considered appropriate. Moreover, as illustrated, some of the plurality of pillar structures 150, such as pillar structures 150A, 150B, are associated with a corresponding buried word line 110A, which is separated from the bottom layers 103B by a dielectric layer 111, which may also be considered as a gate dielectric material. Similarly, the buried word line 110A is isolated from the semiconductor region 102 by the dielectric material 111. Furthermore, the pillar structures 150A, 150B are separated from each other by an isolation region (not shown), as will be described in more detail later on. On the other hand, pillar structures 150C, 150D are associated with another one of buried word lines 110C, wherein each of the buried word lines 110A, 110C represent a respective portion of an initially formed combined word line, as will be described later on. Moreover, the pillar structures 150A, 150B on the one hand, and the pillar structures 150C, 150D are separated by a trench isolation region 104A along a lateral direction that corresponds to a length direction of the buried word lines 110A, 110C. Furthermore, bit lines 120 may be provided so as to extend substantially transversely with respect to the buried word lines 110A, 110B so as to allow an individual access to each of the pillar structures 150A, 150B, 150C, 150D in order to initiate a current flow through a respective one of the pillar structures 150 via a respective one of the bit lines 120 and the shared semiconductor region 102. In the embodiment shown, the bit line 120A may be formed commonly on the pillar structures 150C, 150A, while the bit line 120B may be formed so as to be in contact with the pillar structures 150D and 150B. Consequently, since each of the buried word lines 110A, 110C and each of the bit lines 120 is associated with a respective line or row of pillar structures in one direction, and with a respective one of lines and rows in a direction perpendicular to the former direction, each pillar structure may be accessed individually by appropriately activating a corresponding one of the buried word lines 110A, 110C and one of the bit lines 120.

Figure 2:
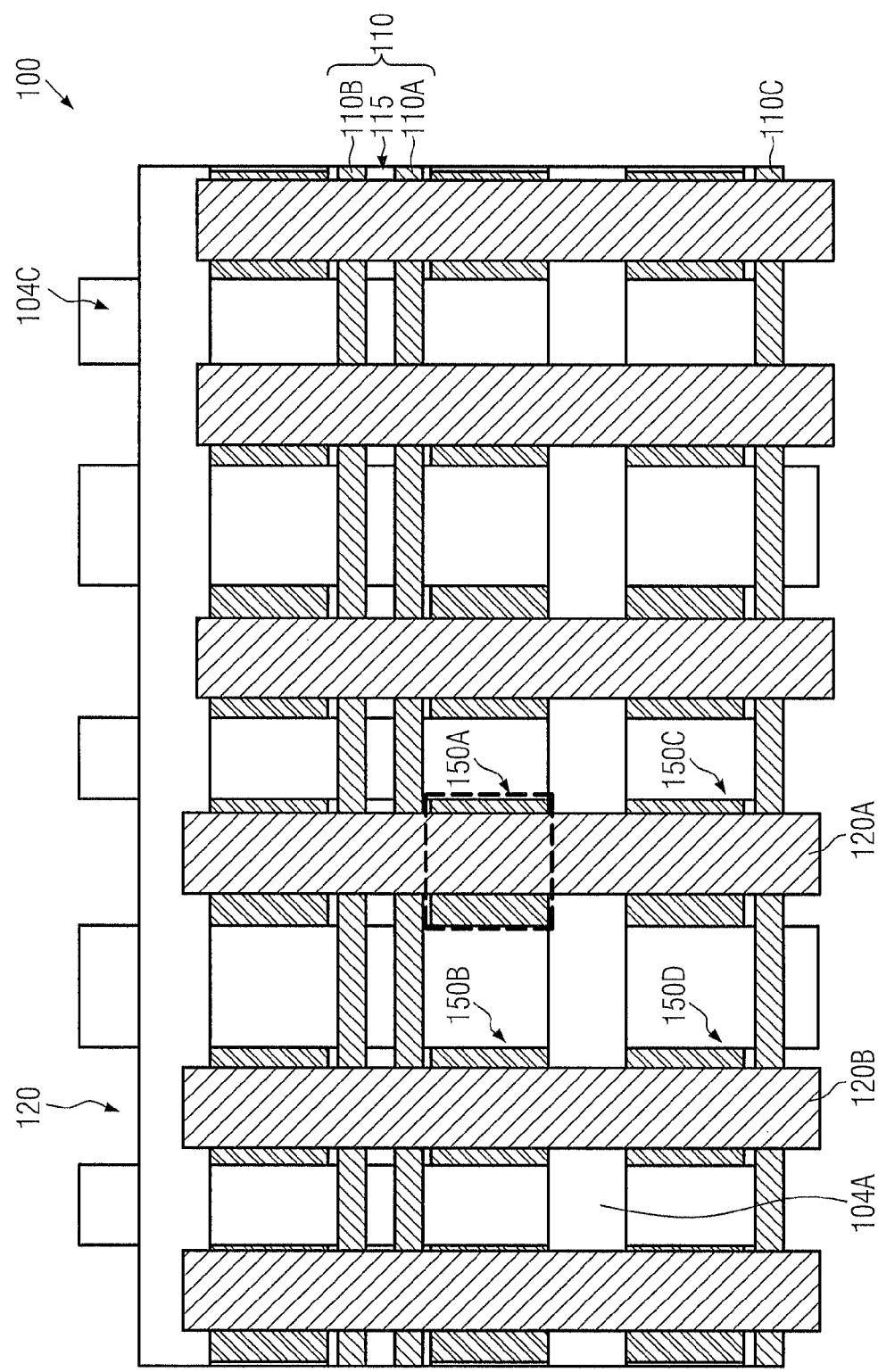
FIG. 2 schematically illustrates a top view of an array of pillar structures and a corresponding word and bit line system for individually accessing a memory cell of the array, according to illustrative embodiments.

FIG. 2 schematically illustrates a semiconductor device 100 in a top view. As shown, the pillar structures 150A, 150B are separated by the trench isolation region 104A from the pillar structures 150C, 150D. The pillar structures 150C, 150D are "connected" or associated with the split word line 110C, while the pillar structures 150A, 150B are associated with the split word line 110A. Furthermore, as shown for the word line 110A, each of the split word lines may represent a portion of an initially combined word line 110, wherein respective word line portions, such as the word line 110A, and a corresponding word line portion 110B of the initially combined word line 110 are separated by a word line trench isolation region 115. Moreover, trench isolation regions 104C are provided so as to define the lateral size of the pillar structures 150A, 150B, 150C, 150D so that, based on the trench isolation regions 104C and 104A, appropriate dimensions and thus sizes of the basic pillar structures may be appropriately defined, wherein self-aligned manufacturing techniques may be applied, thereby reducing overall process complexity and providing superior production yield. Consequently, a line of pillar structures, for instance including the pillar structures 150A, 150B, may be addressed by activating the associated word line, such as the word line 110A, while a corresponding row may be activated by enabling a desired bit line, such as the bit line 120A, thereby accessing the pillar structure 150A. Consequently, upon providing the common semiconductor region or sense plate 102 (FIG. 1), a very efficient processing mode may be realized on the basis of the split word lines 110A, 110C and the bit lines 120.

With reference to FIGS. 3a-11c, various embodiments will now be described in more detail in order to form the semiconductor device as shown in FIGS. 1 and 2.

FIG. 3a schematically illustrates a top view of the device 100 in an early manufacturing stage, i.e., in a manufacturing stage in which the stack of semiconductor layers 103 may be patterned so as to obtain trenches 105 in order to form therein the trench isolation regions 104C (FIG. 2). To this end, appropriate lithography techniques may be applied in which an appropriate material, such as a silicon nitride material and the like, may be provided above the layer stack 103 in order to act as a hard mask material. To this end, any well-established process techniques as are frequently used for the formation of trench isolations may be applied. Hence, upon patterning the silicon nitride material, it may be etched into the semiconductor material of the stack 103 on the basis of well-established etch recipes.

FIG. 3b schematically illustrates a cross-sectional view of the device 100 along a section as indicated in FIG. 3a. As shown, the trenches 105 may be formed in a cap layer 106, such as a silicon nitride material as discussed above, and the trenches 105 may extend through the top layer 103T and the bottom layer 103B and into the semiconductor region 102. Furthermore, a dielectric liner material 106L, such as a silicon nitride material, may be formed on inner sidewall surface areas of the trenches 105.

The device 100 as shown in FIG. 3b may be formed by providing the following process strategies. The buried doped region 102 and the layer stack 103 may be formed on the basis of implantation techniques and/or by applying epitaxial growth techniques in which an appropriate dopant species may be incorporated during the respective deposition process. In this manner, an appropriate dopant concentration and appropriate PN junctions may be obtained between the layers 103T and 103B on the one hand, and between the layer 103B and the semiconductor region 102 on the other hand. Thereafter, the mask material 106, possibly in combination with additional etch stop liners (not shown), may be formed and may be subsequently patterned, as described above. After completing the trenches 105, the liner 106L may be formed on the basis of any appropriate deposition technique.

FIG. 4a schematically illustrates a top view of the device 100 in a further advanced manufacturing stage. As shown, the trench isolation regions 104C may be formed so as to laterally delineate respective stripes in the semiconductor layer stack 103.

FIG. 4b schematically illustrates a cross-sectional view of the device 100 in a further advanced manufacturing stage. As shown, the isolation trenches 104C may be provided, for instance, in the form of an oxide material and the like, while an additional cap material 106C is formed above the layer stack 103 and the isolation trenches 104C. The insulating material may be incorporated on the basis of any appropriate deposition technique, such as spin-on techniques, chemical vapor deposition (CVD) and the like, possibly in combination with an additional heat treatment, for instance when providing the insulating material on the basis of spin-on techniques. Thereafter, any excess material may be removed, for instance, by chemical mechanical polishing or planarizing (CMP), wherein well-established removal recipes are available for, for instance, removing oxide material selectively with respect to silicon nitride and silicon, wherein the silicon nitride material of the layer 106C may be used as an efficient material for controlling the overall removal process. Thereafter, cap material 106C may be deposited by any appropriate deposition technique. On the basis of the cap layer 106C, the processing may be continued by performing a further lithography process for defining the lateral position and size of combined word lines.

FIG. 5a schematically illustrates a top view of the device 100 in a further advanced manufacturing stage. As shown, the combined word lines 110 may be provided, wherein, for convenience, only one complete word line 110 is illustrated in FIG. 5a. Moreover, the representation of FIG. 5a is, for convenience, not true to scale. As shown, combined word lines 110 extend substantially perpendicularly with respect to the trench isolation regions 104 and thus separate the semiconductor layer stacks 103 into stripes of reduced length.

FIG. 5b schematically illustrates a cross-sectional view through the semiconductor layer stacks 103. As shown, a corresponding trench 110T is formed so as to extend into the layer stack 103, i.e., through the layer 103 and down to the buried semiconductor material 102 (FIG. 1). Moreover, the trench 110T has formed on inner sidewall areas thereof a dielectric material 111, such as a silicon dioxide-based material and the like, which may act as an efficient gate dielectric material. Moreover, a conductive material 112 such as tungsten, possibly in combination with any barrier materials (not shown) and the like, or any other appropriate conductive material, may be formed in a portion of the trench 110T.

The device 100 as shown in FIG. 5b may be formed on the basis of the following processes. After patterning the cap layer 106C by appropriate lithography techniques, the trench 110T may be etched by using well-established plasma assisted etch recipes so as to extend to the desired depth. Thereafter, the dielectric material 111 may be formed, for instance, by oxidation and/or deposition using well-established process strategies. Thereafter, the conductive material 112, which may be provided in the form of two or more individual material layers, may be deposited, for instance using sputter deposition techniques, CVD and the like. Next, any excess material may be removed, for instance by CMP and/or etching, while, in a final phase of the removal process, a desired degree of recessing may be achieved in the trenches 110T, thereby adjusting the desired height of the conductive material 112 so as to enable appropriate transistor operation, i.e., formation of a channel region in the bottom layer 103B.

FIG. 5c schematically illustrates the device 100 in this manufacturing stage wherein the cross-section is taken through the trench isolation regions 104C. On the basis of the device configuration as shown in FIGS. 5b and 5c, the processing may be continued by applying a self-aligned process technique for "splitting" the combined word lines 110 in corresponding portions that are electrically isolated from each other.

FIG. 6a schematically illustrates the device 100 in a corresponding manufacturing stage. As illustrated, the combined word line 110 comprises an intermediate trench isolation region 115 so as to provide the electrically insulated split word line portions 110C, 110A.

FIG. 6b schematically illustrates a cross-sectional view through the semiconductor layer stacks 103. As shown, the intermediate isolation region 115 separates the conductive materials 112A, 112C of the corresponding split word lines, wherein an additional process portion 115E of the isolation region 115 extends above the trench 110T. The device 100 as shown in FIG. 6b may be formed on the basis of the following process techniques. Starting from a device configuration as shown in FIGS. 5b and 5c, an appropriate spacer material, such as a silicon dioxide material and the like, may be deposited in a substantially conformal manner by any appropriate deposition technique. Consequently, a corresponding liner may be formed within the trench 110T, thereby temporarily "reducing" the width of the trench 110T. Thereafter, an appropriate anisotropic etch process may be applied so as to etch through the liner material at the bottom, while still preserving respective sidewall spacers (not shown), which thus act as a hard mask material for subsequently etching into the conductive material, thereby finally forming the split portions 112A, 112C. During the etch process, the liner 111 at the bottom of the trench 110T may act as an efficient etch stop material. It should be appreciated that even a complete removal of an exposed portion of the dielectric material 111 may not negatively affect the overall device characteristics since, in a subsequent process step, the dielectric material of the region 115 may be deposited, for instance in the form of oxide material and the like, thereby also reliably passivating the materials 112A, 112C with respect to any underlying semiconductor material. Thereafter, any excess material may be removed, for instance by CMP, wherein the cap layer 106C (FIGS. 5b, 5c) may act as an efficient stop material. Thereafter the silicon nitride material, i.e., the cap layer 106C (FIGS. 5b, 5c), may be removed selectively with respect to the excess material 115E and the layer stack 103, thereby obtaining the surface topography as shown in FIG. 6b.

FIG. 6c schematically illustrates the cross-sectional view within the isolation trench 104, wherein basically the same device topography may be obtained after splitting the combined line into the word lines 110A, 110C by means of the isolation trench 115.

It should be appreciated that in the manufacturing stage shown in FIGS. 6a-6c, the corresponding split word lines are associated with an adjacent stripe of the semiconductor layer stack 103, wherein two split word lines are associated with the same layer stack. For example, the split word line 110D and the split word line 110A connect to the same stripes of the semiconductor layer stacks 103. Consequently, during the further processing, the actual size of the pillar structures may be defined by splitting or dividing the stripes 103 between the respective two of the split word lines. To this end, the surface topography as shown in FIGS. 6b and 6c may be taken advantage of in order to form appropriate spacers on the excess portions 115E in order to define appropriate openings so as to etch into the layer stacks 103 in a self-aligned manner.

FIG. 7a schematically illustrates a top view of the device 100 in a further advanced manufacturing stage. As shown, appropriate openings 1070 may be provided by responding spacer elements 107S, which are provided in combination with the previously provided excess material 115E. In this manner, the openings 1070 and thus appropriate trench isolation regions may be defined without requiring any additional lithography techniques.

FIG. 7b schematically illustrates a cross-sectional view through the openings 1070. As shown, the openings 1070 may be provided on the basis of spacer elements 107S, which may be formed on sidewalls of the extension regions 115E. Consequently, during a subsequent anisotropic etch process, the spacers 107S and thus the openings 1070 may be used as an etch mask for forming a corresponding trench within the material layer stack 103, thereby appropriately splitting the layer stack and forming the final pillar structures.

FIG. 7c schematically illustrates the device 100 in a cross-sectional view taken along the trench isolation regions 104C. As shown, the openings 1070 substantially extend to the isolation regions 104C due to the high etch selectivity of the material of the regions 104C with respect to silicon.

FIG. 8a schematically illustrates a top view of the device 100 in a further advanced manufacturing stage. As illustrated, the isolation trenches 104A, which extend substantially in parallel with the split word lines 110A, 110C, define the final size and shape of the pillar structures 150A, 150B, . . . . . To this end, the previously formed trenches in the semiconductor layer stack may be filled with an appropriate material, which provides the desired electrical insulation of the pillar structures 150.

FIG. 8b schematically illustrates a cross-sectional view of the device 100. As shown, the pillar structure 150B "connects" to the split word line 110A and is separated in the opposite lateral direction from a neighboring pillar structure by the trench isolation region 104A. To this end, the trench isolation region 104A may be comprised of any appropriate dielectric material, such as silicon dioxide, which may be filled into a respective trench by any appropriate deposition technique, followed by the removal of any excess material, for instance by CMP and the like. In other illustrative embodiments, the trench isolation region 104A may comprise a conductive core material 108C in combination with an insulating liner material 108I, thereby increasing the capacitance of the body region of any adjacent pillar structure, such as the pillar structure 150B. The conductive core 108C may then be connected to a well-defined reference potential, which may be accomplished on the basis of any appropriate contact regime. The materials 108I and 108C may be provided by any appropriate deposition techniques, followed by an appropriate removal process. For example, doped polysilicon material may be used for the material 108C, while in other cases any appropriate metal materials may be applied.

Figure 9A:
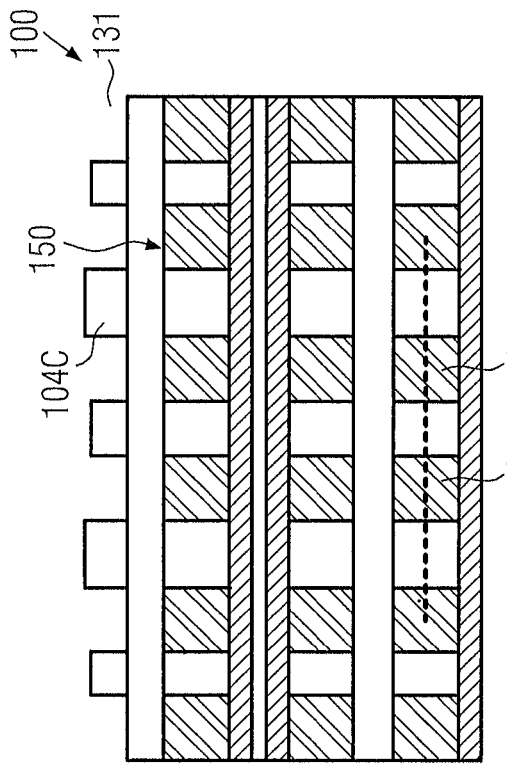
FIGS. 9a-11c schematically illustrate top views and cross-sectional views, respectively, of the semiconductor device in further advanced manufacturing stages in which an appropriate bit line system is provided so as to connect to the pillar structures, according to further illustrative embodiments.

FIG. 9*a* schematically illustrates the device 100 in a further advanced manufacturing stage. As shown, an appropriate electrode material, such as polysilicon, may be applied in combination with an appropriate gate dielectric material, which may be used in other device areas for forming appropriate gate electrode structures (not shown). During a corresponding patterning process, the electrode material 131 may be removed from above the device area comprising the plurality of pillar structures 150 selectively with respect to the gate dielectric material.

Figure 9B:
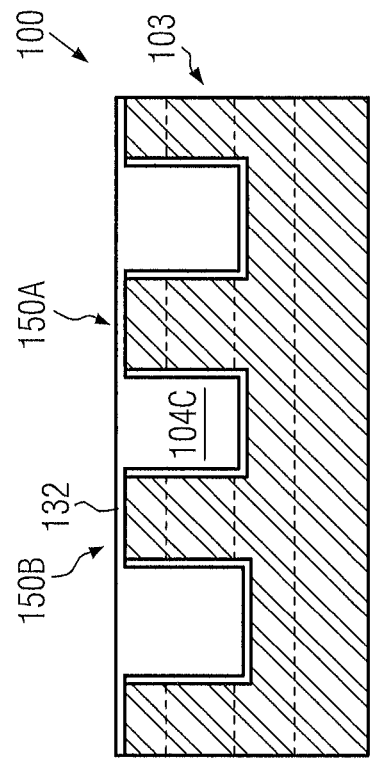

FIG. 9*b* schematically illustrates the cross-sectional view along a direction parallel to the trench isolation regions 104A (see FIG. 8*a*) and perpendicular to the extension of the trench isolation regions 104C (see FIG. 9*a*). As shown, a gate dielectric material 132 may be formed on the pillar structures 150A, 150B after the removal of the gate electrode material 131 (FIG. 9*a*).

Figure 10A:
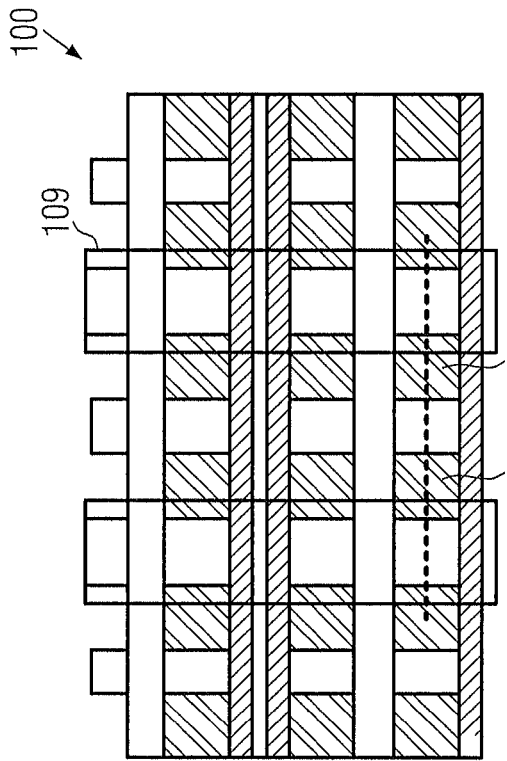

FIG. 10*a* schematically illustrates the device 100 in a further advanced manufacturing stage. As shown, an appropriate isolation liner 109 may be formed, for instance, by depositing a liner material, such as silicon dioxide, and performing a lithography process so as to define respective stripes required for the further processing upon forming bit lines. It should be appreciated that the corresponding liner material may also be removed in other device areas so as to expose any polysilicon material or electrode material in gate electrode structures in these device areas.

Figure 10B:
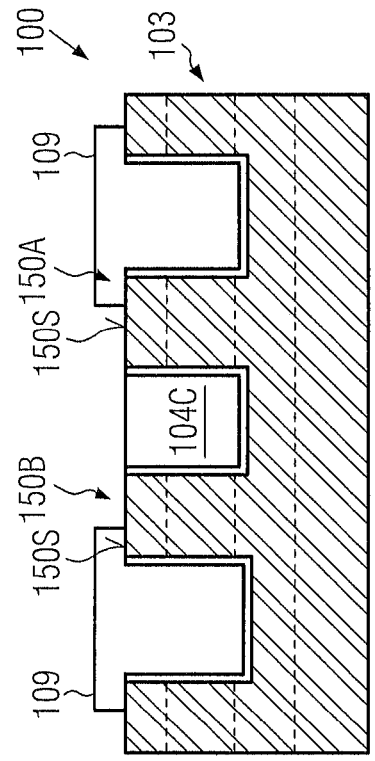

FIG. 10*b* schematically illustrates a cross-sectional view of the device 100 wherein at least a portion of the surface 150S of the pillar structures 150A, 150B, . . . may be exposed, while the remaining device areas are covered by the isolation liner stripes 109. To this end, any appropriate lithography and patterning strategy may be applied. Consequently, the exposed portions of the surface areas 150S may be considered as contact regions for bit lines that are still to be formed above the pillar structures 150.

Figure 11C:
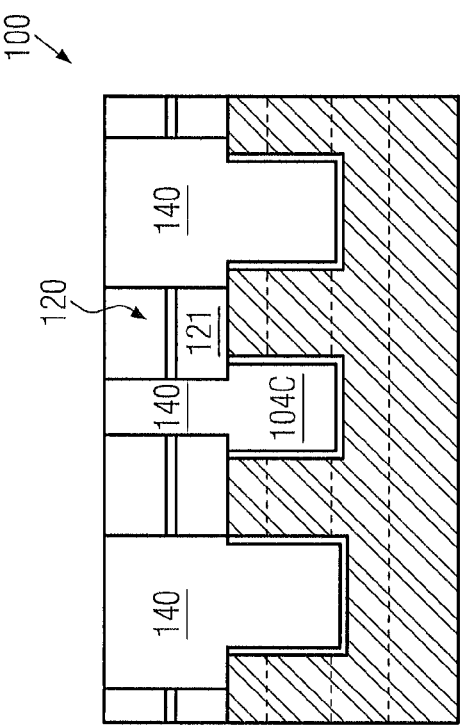
Figure 11A:
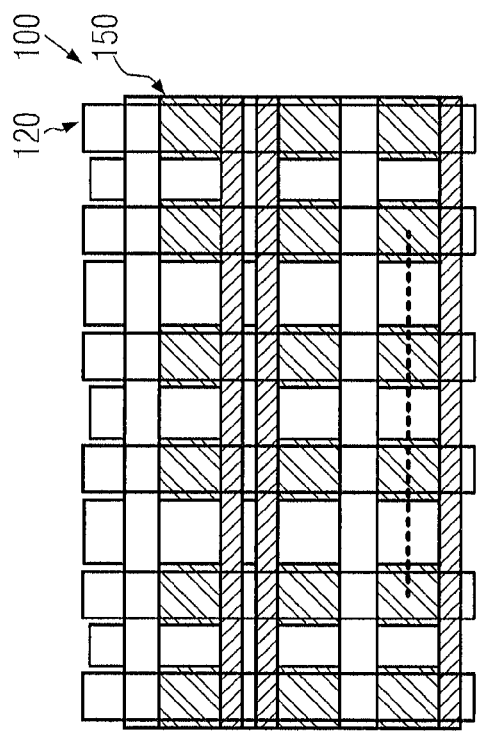

FIG. 11*a* schematically illustrates a top view of the device 100 in a further advanced manufacturing stage. As illustrated, bit lines 120 may be provided on the basis of appropriate electrode materials, such as polysilicon, possibly in combination with a metal-containing material, while also an appropriate cap material may be formed on the electrode materials. To this end, after performing any cleaning recipes, an electrode material, such as polysilicon, may be deposited and any additional materials, such as hard mask materials and the like, may be applied, as required for the subsequent lithography and patterning process sequence. In this manner, the bit lines 120 may be provided so as to connect to the underlying pillar structures.

Figure 11B:
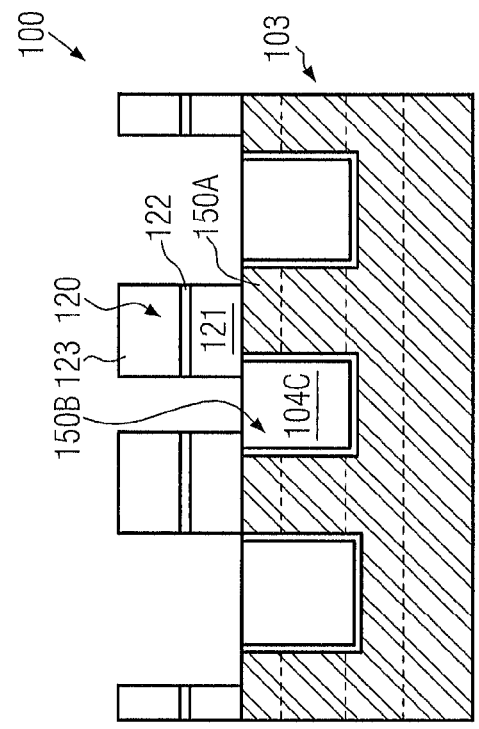

FIG. 11*b* schematically illustrates a cross-sectional view of the device 100 after the above-described process sequence. As shown, the bit lines 120 may comprise a semiconductor-based electrode material 121 in combination with a metal material 122 followed by a dielectric cap layer 123, such as a silicon nitride material and the like. Thus, due to the previously applied liner material 109 (FIGS. 10*a*, 10*b*), an appropriate cleaning process may not unduly affect the isolation trenches, such as the trenches 104C, which may thus result in a superior surface topography upon applying the layer stack for the bit lines 120 and patterning the same. Thereafter, an appropriate fill material, such as silicon dioxide, may be deposited and may be planarized, for instance by CMP.

FIG. 11*c* schematically illustrates a cross-sectional view of the device 100 with an appropriate dielectric material 140 formed between the bit lines 120 and thus above the isolation trenches 104C.

Consequently, the semiconductor device 100, as, for instance, shown in FIGS. 1 and 2, may be formed on the basis of a highly efficient manufacturing flow including a plurality of self-aligned patterning techniques, for instance for forming the intermediate trench isolation regions for splitting the initially combined word lines and also for forming the trench isolation regions 104A (FIG. 1). Furthermore, by providing the common semiconductor region 102 (FIG. 1), a highly efficient addressing mode may be implemented, as is for instance shown in FIG. 2. It should be appreciated that the necessary contacts (not shown) to the devices present at the edges of the memory cell array may be patterned by standard/advanced patterning techniques.

With reference to FIGS. 12-24*b*, further illustrative embodiments will now be described in which an addressing mode may be implemented on the basis of a shared buried sense line, which may connect to corresponding buried semiconductor regions, such as the region 102 as previously discussed, in combination with shared word lines, which may, however, not be required to be split into separate portions. In order to enable individual access, certain subsets of the plurality of pillar structures may be grouped together on the basis of an appropriate bit line contact region which is finally contacted by respective bit lines. Also in this case, a dimensioning of the pillar structures, at least in one lateral direction, may be accomplished on the basis of a self-aligned technique.

Figure 12:
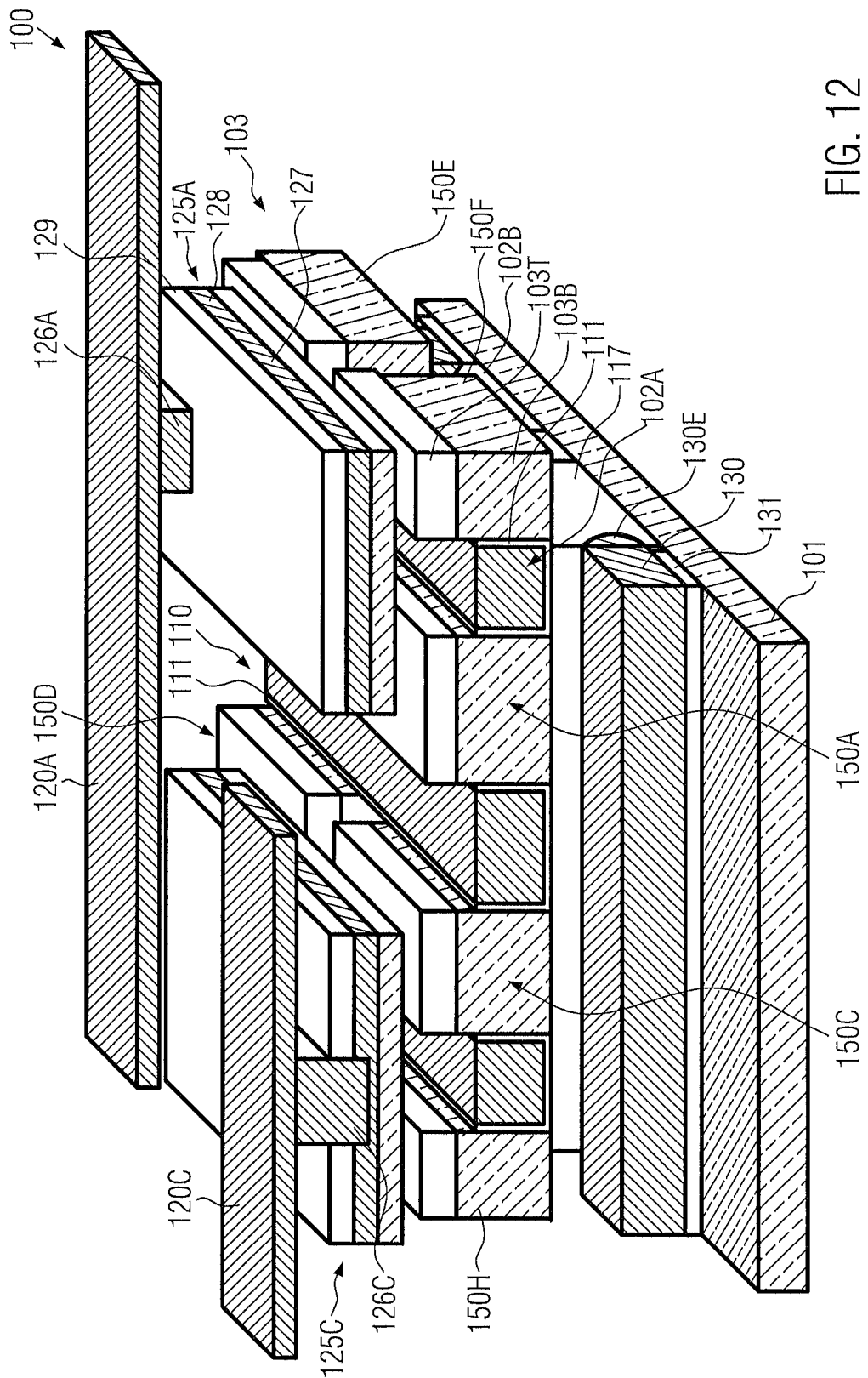
FIG. 12 schematically illustrates a perspective view of the semiconductor device according to further illustrative embodiments in which shared buried word lines and shared buried sense lines may be used in combination with an appropriate bit line contact regime.

FIG. 12 schematically illustrates a perspective view of the semiconductor device 100 comprising a plurality of pillar structures 150A-150H which may have basically the same configuration as described before with reference to FIGS. 1-11. It should be appreciated that like or similar device features and processes may be denoted by the same reference numerals as previously used. Consequently, a detailed description of any such device features or processes will be omitted for the sake of brevity of the description.

Hence, the pillar structures 150A-150H may comprise the bottom layer 103B and the top layer 103T having an appropriate dopant concentration and profile as discussed above. Furthermore, the shared doped semiconductor region may be provided in the form of regions 102A, 102B which may form respective PN junctions with a specific subset of the plurality of pillar structures 150A-150H. For example, the semiconductor region 102A may connect to the pillar structures 150A, 150C, 150F and 150H. Similarly, the doped semiconductor region 102B may connect to the pillar structures 150B (not shown), 150D, 150E and 150G (not shown). Moreover, each of the buried semiconductor regions 102A, 102B may be associated, i.e., directly connected to a corresponding shared buried sense line 130, which is illustrated in FIG. 12 for the semiconductor region 102A. In some illustrative embodiments, as shown in FIG. 12, the sense line 130 may comprise an extension portion 130E on either side, wherein, for convenience, only one is shown, so as to extend into the adjacent buried semiconductor region, such as the region 102A. In this manner, a lateral offset of the sense line 130 with the associated pillar structures, such as the structures 150A, 150C, 150F and 150H, may be obtained in order to further enhance performance of corresponding transistor devices. Moreover, as shown, the sense lines 130 may be isolated from the substrate material 101 by an appropriate dielectric layer 131.

Furthermore, the buried word lines 110 may be considered as "combined" word lines in the sense that each of these word lines is associated with a subset of the plurality of pillar structures 150A-150H such that each word line 110 operatively connects to respective pillar structures on each side thereof. For example, the illustrated word line 110 operatively connects to the bottom layers 103B of the pillar structures 150A, 150B (not shown) on the one side and to the pillar structures 150C and 150D on the opposite side. Furthermore, in order to enable individual access of each of the pillar structures 150A-150H, a corresponding different subset of pillar structures is operatively connected by appropriate bit line contact regions 125A, 125C so that, for unique selection of one of the buried sense lines 130, one of the shared word lines 110 and one of the bit line contact regions 125A, 125C, a single pillar structure may be addressed. For example, the subset of pillar structures electrically connected to the contact region 125A may be the pillar structures 150A, 150F, 150E and 150B (not shown), while the pillar structures 150C, 150H, 150D and 150G (not shown in FIG. 12, see FIG. 13) may directly connect to the bit line contact region 125C. The bit line contact regions 125A, 125C may comprise any appropriate material, such as a polycrystalline material 127 in combination with a metal material 128 followed by an appropriate dielectric cap material 129. Furthermore, the bit lines 120A, 120C may be formed above the contact regions and thus the pillar structures so as to appropriately connect to the respective one of the contact regions 125A, 125C, which may be accomplished by providing the bit lines 120A, 120C in the contact level, for instance on the basis of tungsten and the like, in combination with appropriate contact elements 126A, 126C.

Furthermore, in some illustrative embodiments as shown in FIG. 12, additional "isolation" regions 117 may be provided which may comprise a conductive fill material in combination with a dielectric liner, such as the dielectric material 111, as is also discussed above. In this manner, a significant increase of the capacitance in the bottom layers 103B of any adjacent pillar structure may be achieved, as is also similarly described with reference to the trench isolation regions 104A described with reference to FIG. 8b.

Figure 13:
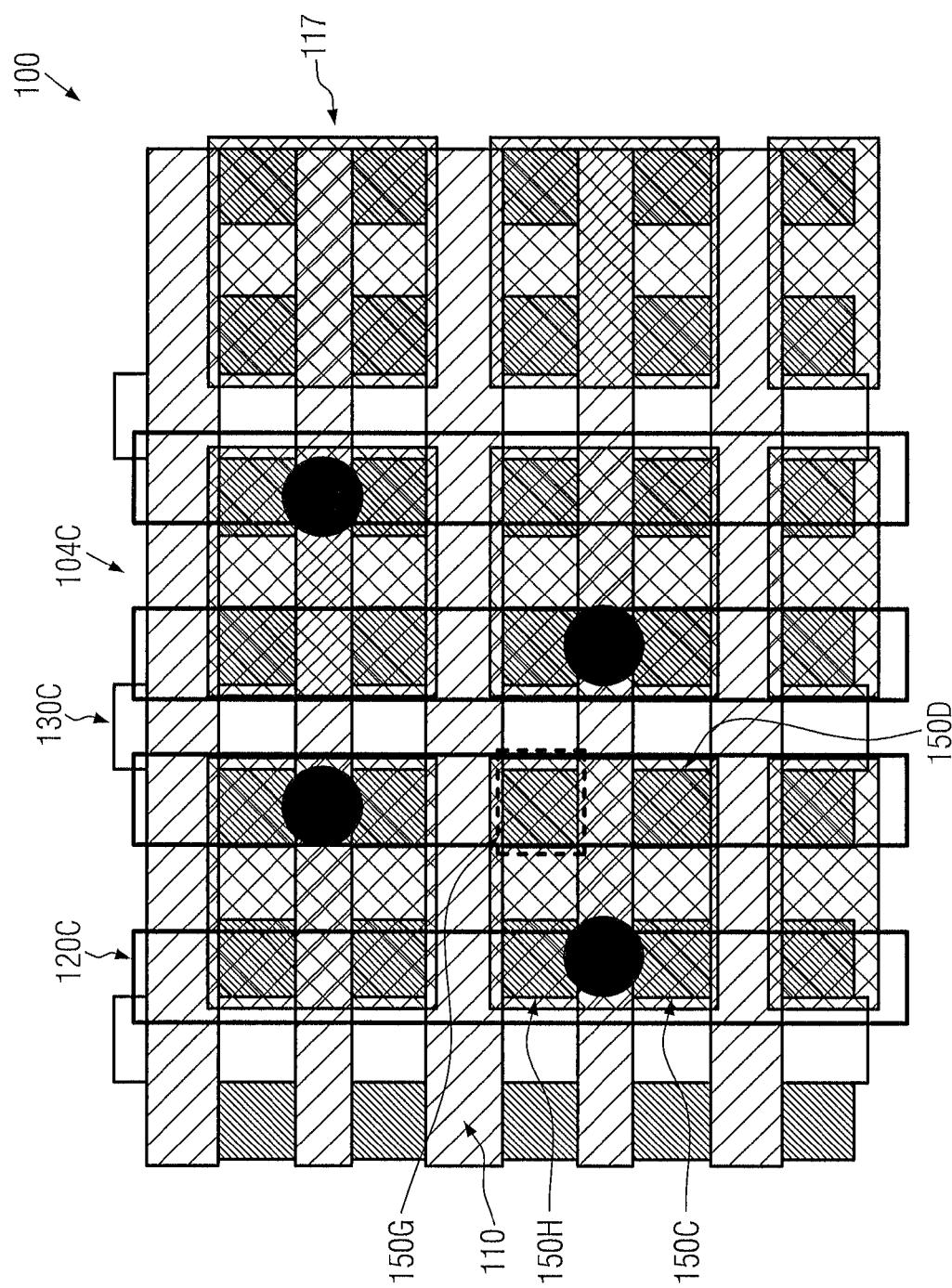
FIG. 13 schematically illustrates a top view of an array of pillar structures formed on the basis of the pillar structures and the contact regime as shown in FIG. 12, according to illustrative embodiments.

FIG. 13 schematically illustrates a top view of a semiconductor device 100 in which an array of the pillar structures 150 may be illustrated in combination with an appropriate addressing mode, for instance for accessing the pillar structure 150G. As shown, the pillar structures 150 may be separated by the trench isolation regions 104C in the direction parallel with respect to the bit lines 120. On the other hand, in the direction parallel to the buried word lines, a separation may be accomplished on the basis of the isolation regions 117 and the word line 110. As shown, in the configuration shown, four pillar structures, such as the pillar structures 150D, 150G, 150H, 150C may represent a corresponding subset of pillar structures which are electrically connected to the same bit line, such as the bit line 120C, by means of the common bit line contact region (see FIG. 12, the bit contact region 125C). Consequently, upon activating the shared sense line 130C, which may thus be functionally associated with the pillar structures 150G and 150D on the one side, in addition to any other pillar structures that do not belong to the subset under consideration, and which also operatively connects to any pillar structures formed adjacent to the opposite side of the sense line 130C, and by enabling the word line 110, the corresponding four pillar structures centered around the intersection of the lines 110 and 130C may be addressed. Thus, by additionally activating the bit line 120C, which connects to the block including the pillar structures 150C, 150D, 150G, 150H, the pillar structure 150G may be selected and accessed.

Figure 14:
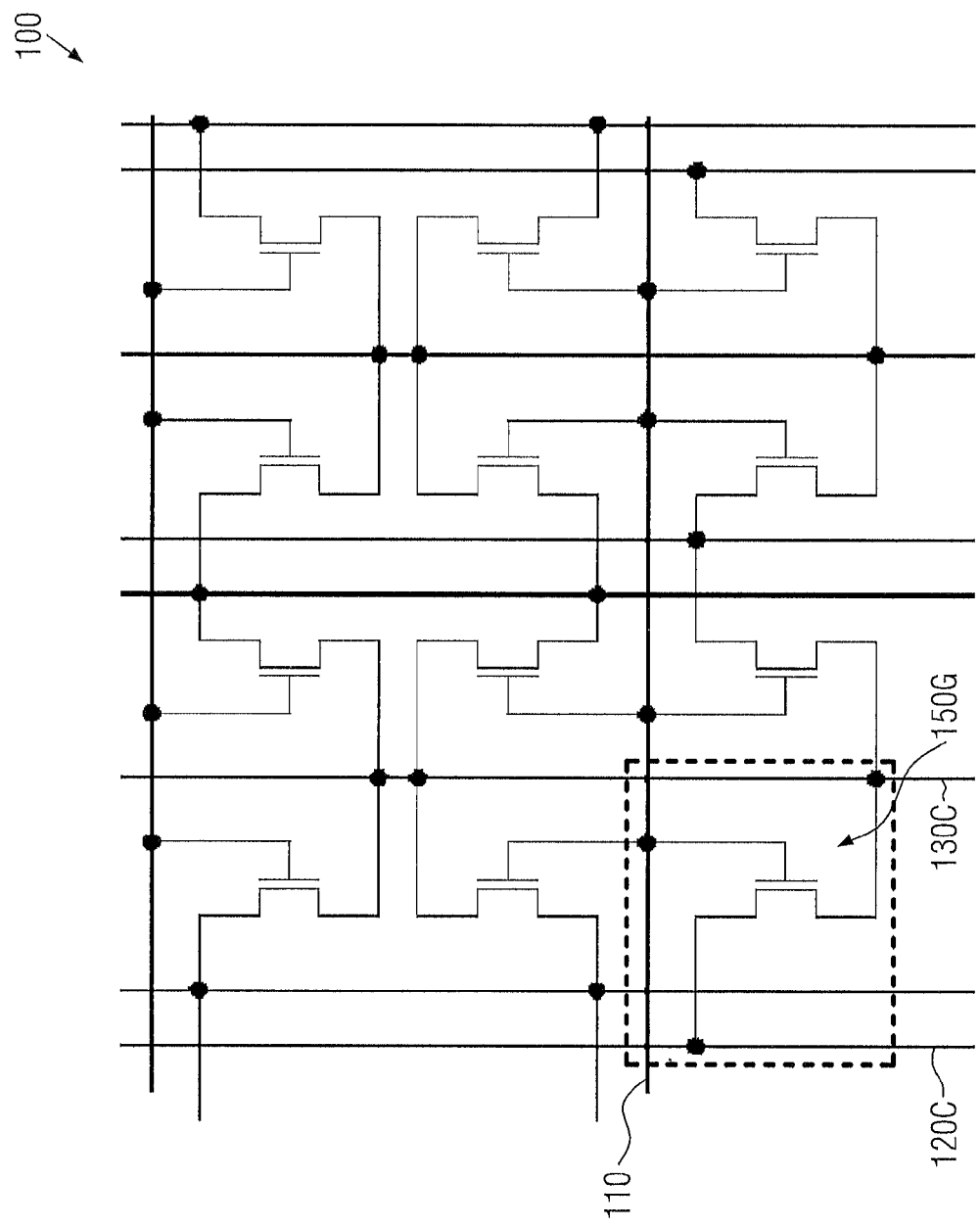
FIG. 14 schematically illustrates an equivalent circuit diagram of a portion of the array shown in FIG. 13.

FIG. 14 schematically illustrates an equivalent circuit diagram wherein the contact regime of the pillar structures of the device 100 is indicated and wherein, by selection of a unique configuration of bit lines, word lines and sense lines, such as the bit line 120C, the sense line 130C and the bit line 110, the pillar structure 150G may be uniquely accessed.

With reference to FIGS. 15a-24b, appropriate manufacturing techniques will now be described in more detail in order to form the semiconductor 100 as shown in FIGS. 12-14.

FIG. 15a schematically illustrates a top view of the device 100 in which an appropriate trench 132 may be formed so as to enable the subsequent formation of the buried sense line 130 (FIG. 12).

FIG. 15b schematically illustrates a cross-sectional view corresponding to the manufacturing stage shown in FIG. 15a. As illustrated, the dielectric cap layer 106 may be formed in combination with the liner 106L so as to extend to a certain depth of the trench 132, which in turn extends through the stack 103 through the buried semiconductor layer 102 and into the substrate 101. To this end, appropriate lithography techniques may be applied so as to pattern the cap layer 106 and form a corresponding trench, which may be subsequently coated with the liner material 106L, as is also discussed above. Thereafter, an oxide liner 133 may be formed and the etch process may be continued by etching through the layer 102 and into the substrate 101, followed by the removal of a significant portion of the liner material 133, thereby exposing sidewall surface areas 132S in order to allow electrical contact to the semiconductor layer 102. To this end, any well-established process techniques may be applied, for instance, filling the trench 132 with an appropriate fill material and recessing the material to a desired depth, followed by a selective etch process for removing an exposed portion of the liner material 133. It should be appreciated that, generally, less critical patterning conditions may be applied for forming the trenches 132 since any double patterning strategy may be avoided.

FIG. 16a schematically illustrates a top view of the device 100 in a further advanced manufacturing stage in which a buried sense line may be formed below an isolation region 104S.

FIG. 16b schematically illustrates a cross-sectional view of the device 100. As illustrated, the buried sense lines 130 may be formed within the drain 132, i.e., in a lower portion thereof, so as to connect to the previously exposed sidewall surface areas 132S. To this end, any appropriate conductive barrier material, such as titanium silicide and the like, may be provided, in combination with an appropriate conductive material, such as tungsten and the like. After the removal of any excess material, an isolation liner 104I may be formed, for instance in the form of silicon dioxide, silicon nitride and the like, followed by the deposition of a fill material for the isolation region 104S. To this end, any well-established deposition techniques may be applied, followed by the removal of any excess material, for instance using CMP and the like.

FIG. 16c schematically illustrates the device 100 according to illustrative embodiments in which the extension portion 130E may be provided on both sides of the sense line 130, which may be accomplished by applying any isotropic etch chemistry upon exposing the surface area 132S (FIG. 16b) in order to remove a portion of the adjacent semiconductor regions 102. Consequently, after depositing any appropriate fill material, the extension portions 130E may result in superior contact resistivity between the sense line 130 and the adjacent semiconductor regions 102. It should be appreciated that the extension portions 130E are also considered to provide a lateral overlap with the layer stack 103 of each pillar structure formed on either side of the sense line 130.

Figure 17A:
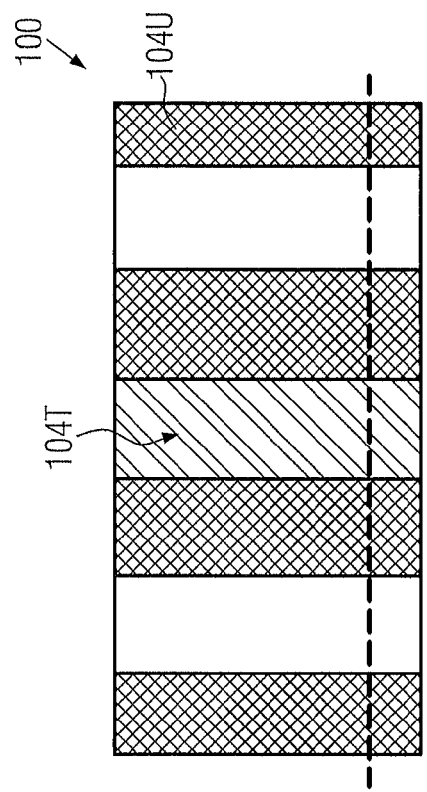
FIGS. 17a-18b schematically illustrate top views and cross-sectional views, respectively, in a manufacturing stage in which trench isolation regions may be formed in a self-aligned manner, according to illustrative embodiments.

FIG. 17a schematically illustrates a top view of the device 100 in a further advanced manufacturing stage in which an isolation trench 104T may be provided in a self-aligned manner on the basis of appropriate spacers 104U.

Figure 17B:
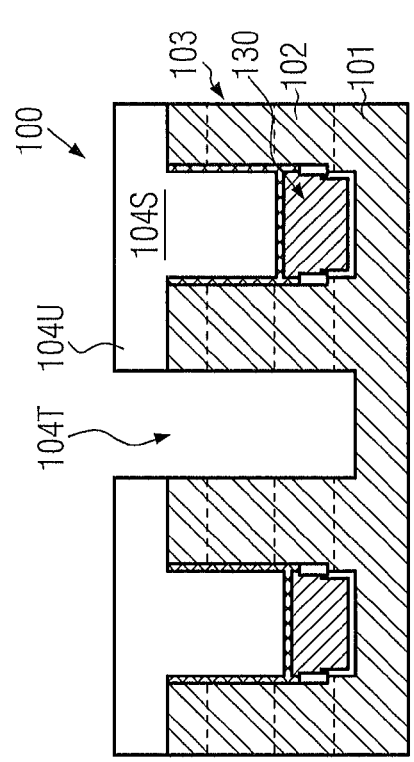

FIG. 17b schematically illustrates a cross-sectional view in which the isolation trench 104T extends through the layer stack 103, the semiconductor layer 102 and into the substrate 101. As shown, the size and position of the trench 104T may be determined by the spacer material 104U. To this end, starting from the device configuration as shown in FIG. 16b, the cap material 106 may be removed or recessed selectively with respect to the isolation region 104S, which may be accomplished on the basis of any appropriate selective etch chemistry. Based on the resulting surface topography, i.e., the protruding isolation regions 104S, a spacer layer may be formed and may be subsequently etched so as to obtain a desired opening that corresponds to the lateral dimensions of the trench 104T. Thereafter, based on the spacers 104U, the processing may be continued by etching into the semiconductor material in order to obtain the trench 104T, thereby defining the dimensions of the pillar structures in one lateral direction.

Figure 18A:
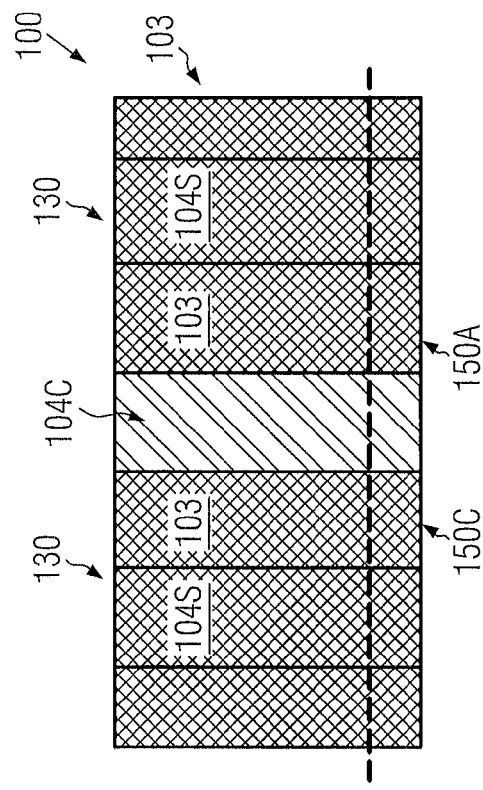

FIG. 18a schematically illustrates a top view of the device 100 in a further advanced manufacturing stage. As shown, the corresponding trench isolation regions 104C may be formed so as to laterally delineate respective stripes of the semiconductor layer stack 103, wherein the stripes extend parallel with respect to the buried sense lines 130 having formed thereon the isolation regions 104S.

Figure 18B:
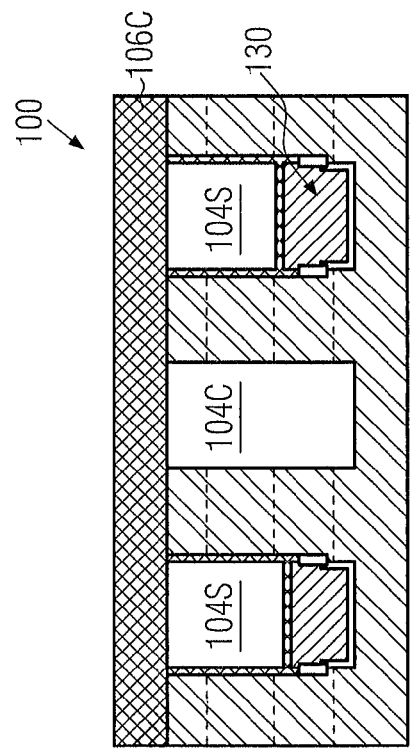

FIG. 18b schematically illustrates a cross-sectional view of the device 100 in this manufacturing stage. As shown, the isolation regions 104S and 104C, which may thus determine the lateral extension of pillar structures in a direction perpendicular to the sense lines 130 may be covered by the cap layer 106C. The device 100 as shown in FIG. 18b may be formed, starting from the configuration as shown in FIG. 17b, by filling in an appropriate dielectric material, such as silicon dioxide, and performing a planarization process, for instance by CMP, electro CMP and the like. Thereafter, the cap material 106C may be deposited.

FIG. 19a schematically illustrates a top view of the device 100 in a further advanced manufacturing stage, i.e., after the formation of the buried word lines. As shown, the buried word lines 110 including the dielectric material 111 may be provided so as to extend substantially perpendicularly to the previously formed trench isolation regions 104C and the isolation regions 104S, which cover the buried sense lines, as discussed above. Furthermore, in the embodiment shown, the metal filled isolation regions 117 may be provided together with the dielectric material 111.

FIG. 19b schematically illustrates a cross-sectional view along the stripe of semiconductor layer stacks 103. As shown, respective trenches are formed so as to extend into the layer stack 103, wherein the trenches are coated with the dielectric material 111. For example, the word lines 110 may be provided with an appropriate width that is greater than a width of the isolation regions 117 having formed therein a desired conductive material. To this end, any appropriate lithography technique may be applied, for instance a double patterning process for subsequently defining the dimensions of the different sized trenches in the cap layer 106C, which may act as mask material during the subsequent patterning of the underlying semiconductor materials. Thereafter, the liner 111 may be deposited or formed by oxidation, depending on the process strategy, followed by the incorporation of any appropriate fill material, such as tungsten, possibly in combination with appropriate barrier materials and the like. Thereafter, any excess material may be removed by CMP and etching in order to adjust a height of the word lines 110 and the lines 117.

FIG. 19c schematically illustrates a corresponding cross-sectional view along the trench isolation region 104C.

It should be appreciated that the trenches for the lines 117 may be formed in a separate patterning process, for instance on the basis of a self-aligned technique, i.e., by forming appropriate spacers on the device having the surface topography obtained after refilling the word lines 110 with an appropriate dielectric material, such as oxide, and removing any excess material thereof to obtain a planar surface topography. Thereafter, the cap layer 106C may be removed selectively with respect to the previously formed fill material so that corresponding openings are created above the device areas in which the trenches for the lines 117 have to be provided. Subsequently, an appropriate spacer layer may be deposited and may be patterned so as to obtain a hard mask for etching into the semiconductor material. In this manner, any appropriate material system may be incorporated into the resulting lines 110 so as to provide superior process and device flexibility with respect to the material composition of the buried word lines 110 and the lines 117.

FIG. 20a schematically illustrates a top view of the device 100 in a further advanced manufacturing stage, i.e., after the incorporation of an appropriate dielectric fill material and the removal of the dielectric cap material 106C (FIGS. 19b, 19c). Consequently, in this stage, the final lateral size of the pillar structures may be defined, for instance a column of pillar structures 150H, 150C, 150A, 150B may be defined by means of the trench isolation regions 104C and the lines 117, 110.

FIG. 20b schematically illustrates a cross-sectional view with the buried word line 110 operatively connecting at one side to a pillar structure 150C and at the opposite side to the pillar structure 150A. The device shown in FIG. 20b may be formed by depositing an appropriate fill material and performing a planarization process including the removal of any residues of the cap layer.

Figure 21A:
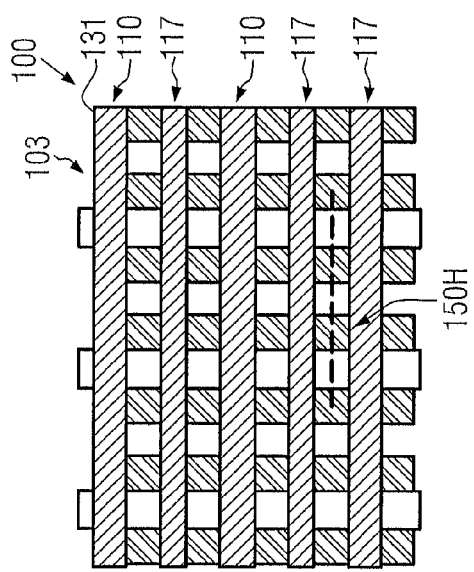

FIG. 21a schematically illustrates a top view of the device 100 in a further advanced manufacturing stage in which the electrode material 131 may be provided together with an appropriate gate dielectric material, wherein the material 131 may subsequently be removed above the plurality of pillar structures 150.

Figure 21B:
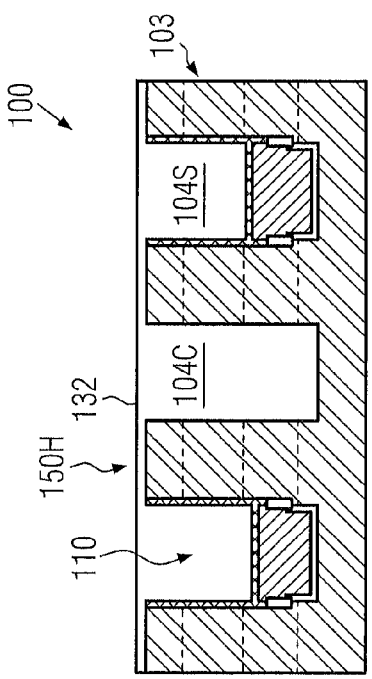

FIG. 21b schematically illustrates a cross-sectional view of the device according to this manufacturing stage. As shown, after the removal of the material 131 (FIG. 21a), the dielectric material 132 may be formed on the pillar structures, such as the structure 150H, and possibly on the isolation regions 104C, 104S, depending on the process technique applied for forming the dielectric material 132.

Figure 22A:
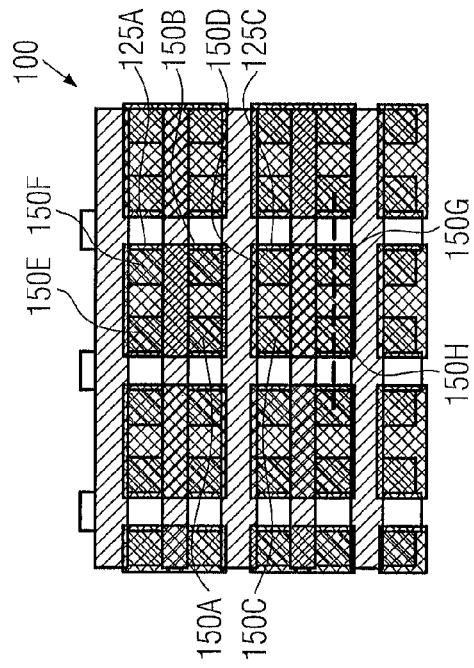
FIGS. 21a-22b schematically illustrate top views and cross-sectional views, respectively, in a manufacturing phase in which shared bit line contact regions may be provided on the basis of semiconductor-based patterning strategies, according to illustrative embodiments.

FIG. 22a schematically illustrates a top view of the device 100 in a further advanced manufacturing stage. As shown, respective bit line contact regions 125A, 125C may be formed so as to be connected to respective four pillar structures. For example, the bit line contact region 125A connects to the pillar structures 150A, 150B, 150E, 150R while the bit line contact region 125C connects to the pillar structures 150C, 150D, 150G and 150H.

Figure 22B:
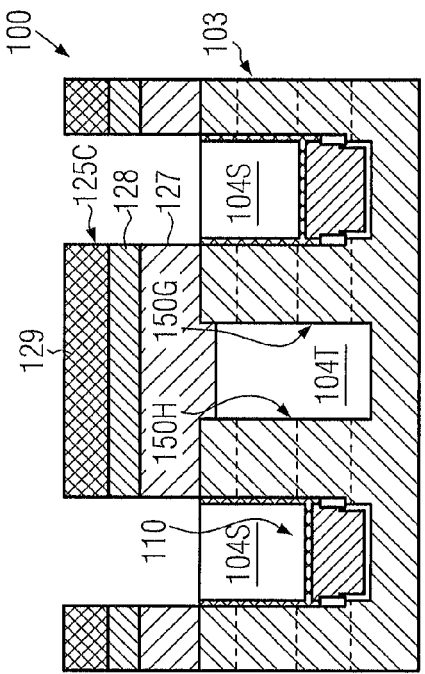

FIG. 22b schematically illustrates a cross-sectional view of the device 100 in this manufacturing stage. As shown, the contact region 125C connects to a top surface of the pillar structures 150H, 150G, wherein the region 125C may comprise an electrode material 127, such as polysilicon, in combination with a metal-containing electrode material 128, followed by a dielectric cap layer 129. To this end, based on the configuration as shown in FIG. 21b, the layer 132 may be removed on the basis of a non-masked etch process, thereby selectively removing the material 132 above the pillar structures, while in other device areas the gate dielectric material 132 may be reliably covered by the previously provided polysilicon material. Thereafter, any cleaning recipes may be applied and the materials for the bit line contact regions 125C may be provided. For example, a polysilicon material may be deposited in combination with a metal-containing material followed by the cap layer 129. Thereafter, any appropriate lithography technique may be applied so as to define the required size for the bit line contact regions. Thereafter, an etch process may be applied so as to obtain the contact region 125C as shown in FIG. 22b.

Figure 23A:
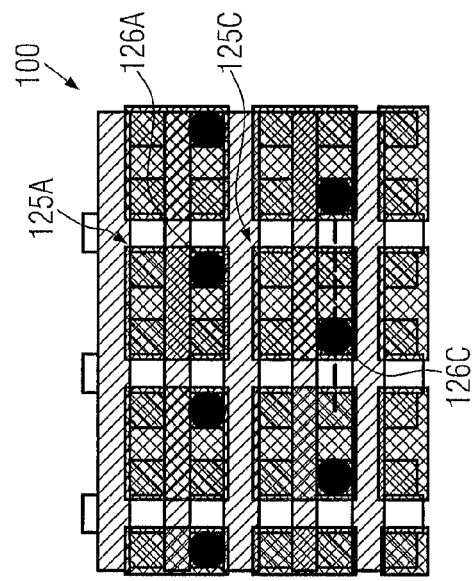

FIG. 23a schematically illustrates a top view of the device 100 in a further advanced manufacturing stage. As shown, contact elements such as the contact elements 126A, 126C are formed so as to respectively connect to a corresponding one of the bit line contact regions, such as the regions 125A, 125C. Similarly, in other device areas, i.e., non-memory areas, corresponding contact elements may be formed.

Figure 23B:
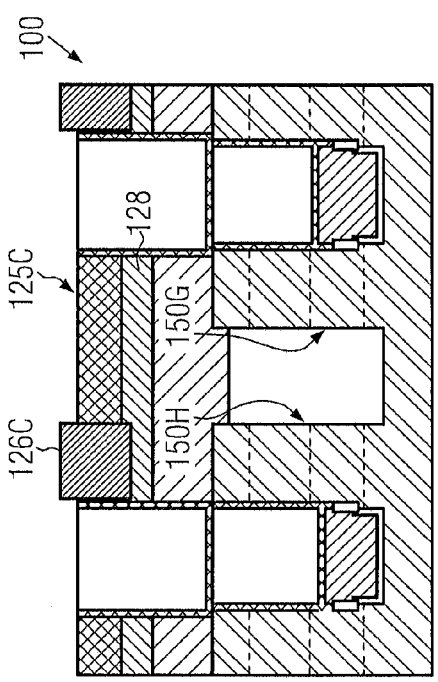

FIG. 23b schematically illustrates a cross-sectional view of the device 100 in which the contact element 126C is illustrated so as to connect to the layer 128 of the contact region 125C. To this end, any appropriate contact regime may be applied, for instance by forming an appropriate interlayer dielectric material and applying well-established lithography and etch techniques, followed by the deposition of any appropriate conductive material, such as tungsten and the like.

Figure 24A:
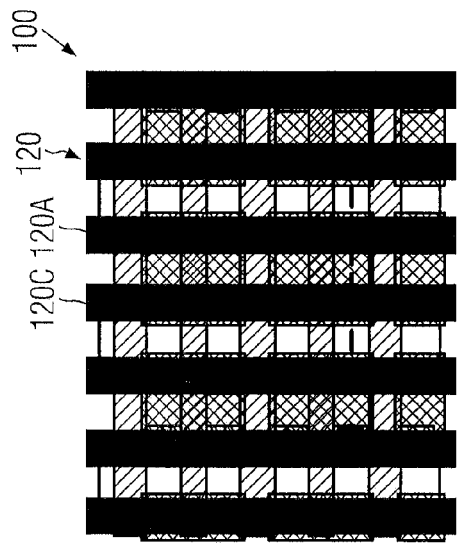
FIGS. 23a-24b schematically illustrate top views and cross-sectional views, respectively, in a manufacturing phase in which bit lines may be formed in the contact level together with appropriate bit line contacts, according to illustrative embodiments.

FIG. 24a schematically illustrates the device 100 in a further advanced manufacturing stage in which the bit lines 120 may be formed so as to appropriately connect to the previously provided contact elements. To this end, any appropriate patterning regime may be applied, for instance by depositing an appropriate metal material and patterning the same on the basis of well-established process regimes, while in other cases a dielectric material may be provided and may be patterned so as to obtain trenches which may be subsequently filled with any appropriate metal material.

Figure 24B:
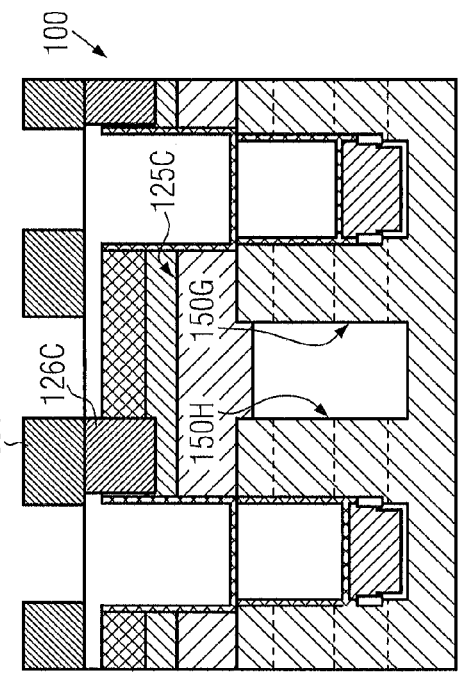

FIG. 24b schematically illustrates a cross-sectional view of the device 100 wherein bit lines are formed above the contact region 125C and corresponding isolation regions, such as the region 125C, with an appropriate pitch so as to position a respective two of the bit lines 120 above one contact region, such as the region 125C. However, only one of these bit lines is connected to a respective one of the lower-lying contact regions, as is for instance shown for the bit line 120C, which connects to the contact element 126C and thus to the contact region 125C.

Consequently, by means of the contact regime provided by the bit lines 120 and the contact regions 125A, 125C, the addressing mode may be implemented, as discussed above with reference to FIGS. 13, 14.

As a result, the present disclosure provides manufacturing techniques and semiconductor devices in which floating body transistors may be provided in a pillar structure, thereby ensuring a reliable electrical isolation of the corresponding body regions. Furthermore, buried word lines and sense lines or sense regions may be provided which, in some illustrative embodiments, may result in an addressing mode that allows individual access of a pillar structure by activating a dedicated bit line and a word line, while the sense line or region may be provided commonly for a large number of pillar structures. In this concept, the initially buried word lines may be split into isolated word line portions on the basis of a self-aligned process technique. In other illustrative embodiments, shared word lines and sense lines may be used, wherein an appropriate addressing mode may be established by a bit line contact regime in which an appropriate subset of pillar structures may be contacted by a dedicated bit line that connects to a single contact element. Also in this case, appropriate isolation trenches may be formed on the basis of a self-aligned process technique. For example, the buried sense lines may be formed with less critical lithography techniques since a double patterning may not be necessary. Furthermore, if required, an additional increase of the body capacitance may be accomplished by incorporating appropriate conductive materials into isolation regions, wherein the conductive materials may be connected to an appropriate reference potential.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a stack of doped semiconductor layers above a doped semiconductor region of a first conductivity type, said stack comprising a top layer of said first conductivity type and a bottom layer of a second conductivity type, said bottom layer forming a PN junction with said doped semiconductor region;
    forming first trench isolation regions in said stack of doped semiconductor layers;
    forming combined word lines in said stack of doped semiconductor layers and said first trench isolation regions, said combined word lines extending substantially transversely to said first trench isolation regions;
    forming second trench isolation regions in said stack of doped semiconductor layers, said second trench isolation regions extending substantially transversely to said first trench isolation regions and laterally delineating, in combination with said first trench isolation regions and said combined word lines, a plurality of pillar structures comprising said top and bottom layers;

forming a word line trench isolation region in each of said combined word lines so as to form a first split word line and a second split word line from each of said combined word lines, said word line trench isolation region including an excess material portion extending above said top layer;

forming spacers on said excess material portion;

etching said plurality of pillar structures using said spacers and said excess material portion as an etch mask to form trenches in said plurality of pillar structures;

filling said trenches with an insulating material to form third isolation trenches extending substantially parallel to said first trench isolation regions and further delineate said plurality of pillar structures; and removing said excess material portion and said spacers.

2. The method of claim 1, further comprising forming a bit line contact region on each of said plurality of pillar structures by exposing a portion of said bottom layer and forming a bit line thereon.

3. The method of claim 1, wherein forming said combined word line comprises forming word line trenches in said stack of doped semiconductor layers and in said first trench isolation regions, forming a dielectric liner on exposed surface areas of said word line trenches and forming a conductive material on said dielectric liner.

4. The method of claim 3, wherein forming said word line trench isolation region comprises recessing said conductive material, forming a spacer in said recess and performing an etch process so as to remove a portion of said conductive material by using said spacer as an etch mask.

5. A method, comprising:

forming buried sense lines so as to be in contact with a buried doped semiconductor region, said sense lines comprising an isolation region extending through a stack of doped semiconductor layers comprising a doped top layer of a first conductivity type and a doped bottom layer of a second conductivity type, wherein an entirety of each of said buried sense lines is positioned at a depth below said stack of doped semiconductor layers;

forming trench isolation regions in said stack of doped semiconductor layers, each of said trench isolation regions being formed laterally between respective two of adjacent sense lines, wherein forming said trench isolation regions comprises:

forming spacers adjacent said isolation region for each of said sense lines:

etching said stack of doped semiconductor materials using said isolation region and said spacers as an etch mask to form trenches; and filling said trenches with an insulating material to define said trench isolation regions;

forming buried word lines in said stack of doped semiconductor layers and in said trench isolation regions, each of said buried word lines having a first side laterally adjacent to a first pillar structure and having a second side laterally opposite to said first side, said second side being formed laterally adjacent to a second pillar structure; and forming a first bit line contact region and a second bit line contact region, said first bit line contact region being connected to a first plurality of pillar structures, said second bit line contact region being connected to a second plurality of pillar structures, said first plurality of pillar structures being associated with a first one of said sense lines, said second plurality of pillar structures being associated with a second one of said sense lines, said first and second pluralities of pillar structures being associated with the same word line.

6. The method of claim 5, wherein forming said trench isolation regions comprises performing a self-aligned patterning process with respect to said sense line isolation regions so as to form trenches in said stack of semiconductor layers.

7. The method of claim 5, further comprising forming a conductive buried sense line substantially parallel to said word lines, wherein said conductive buried sense line is positioned laterally adjacent to the bottom layer of each of said first plurality of pillar structures so as to define the final pillar shape to form a back capacitor for enhanced memory capacitance.

8. The method of claim 7, wherein said buried sense line contacts said buried doped semiconductor region along the entire length of said buried doped semiconductor region.

9. The method of claim 7, wherein said first buried sense line contacts said buried doped semiconductor region along an entire length of said buried doped semiconductor region associated with said first plurality of pillar structures.

10. The method of claim 9, wherein said second buried sense line contacts said buried doped semiconductor region along an entire length of said buried doped semiconductor region associated with said second plurality of pillar structures.

* * * * *